(12) United States Patent
Yoshiike

(10) Patent No.: US 9,321,261 B2
(45) Date of Patent: Apr. 26, 2016

(54) WIRING SUBSTRATE, DROPLET EJECTION HEAD, PRINTING APPARATUS, ELECTRONIC DEVICE, AND MANUFACTURING METHOD FOR WIRING SUBSTRATE

(71) Applicant: SEIKO EPSON CORPORATION, Tokyo (JP)

(72) Inventor: Masashi Yoshiike, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/590,832

(22) Filed: Jan. 6, 2015

(65) Prior Publication Data

US 2015/0191012 A1 Jul. 9, 2015

(30) Foreign Application Priority Data

Jan. 8, 2014 (JP) ................. 2014-001430

(51) Int. Cl.
| | | |
|---|---|---|
| B41J 2/04 | (2006.01) | |
| B41J 2/14 | (2006.01) | |
| H05K 1/18 | (2006.01) | |
| H05K 1/02 | (2006.01) | |
| H05K 3/02 | (2006.01) | |
| B41J 2/16 | (2006.01) | |

(52) U.S. Cl.
CPC ............... *B41J 2/14* (2013.01); *B41J 2/14233* (2013.01); *B41J 2/164* (2013.01); *H05K 1/0284* (2013.01); *H05K 1/0298* (2013.01); *H05K 1/181* (2013.01); *H05K 3/02* (2013.01); *B41J 2002/14491* (2013.01); *H01L 2224/16225* (2013.01); *H05K 2201/09036* (2013.01); *H05K 2201/10234* (2013.01)

(58) Field of Classification Search
CPC ............... B41J 2/14072; B41J 2/17526; B41J 2/04541; B41J 2/14233; B41J 2/1623; B41J 2/161; B41J 2/164; B41J 2002/14491

See application file for complete search history.

(56) References Cited

U.S. PATENT DOCUMENTS 7,784,913 B2   8/2010 Yoda
7,891,782 B2 * 2/2011 Owaki ................. B41J 2/14233
                                                  347/58

FOREIGN PATENT DOCUMENTS

| JP | 07-312466 A | 11/1995 |
|---|---|---|
| JP | 2000-091716 A | 3/2000 |
| JP | 2006-289943 A | 10/2006 |
| JP | 2007-066965 A | 3/2007 |

* cited by examiner

*Primary Examiner* — Juanita D Jackson
(74) *Attorney, Agent, or Firm* — Maschoff Brennan

(57) ABSTRACT

A wiring substrate includes a device substrate having a first surface, a sealing plate having a second surface superimposed on the first surface via an adhesive film and crossing the first surface, and wires set along the surfaces of the first surface, the adhesive film, and the second surface. The wiring substrate includes, between the wires adjacent to each other, a recessed section forming a recess with respect to a first bonding surface of the adhesive which is in contact with the first wire and a second bonding surface of the adhesive which is in contact with the second wire.

10 Claims, 13 Drawing Sheets

WIRING SUBSTRATE, DROPLET EJECTION HEAD, PRINTING APPARATUS, ELECTRONIC DEVICE, AND MANUFACTURING METHOD FOR WIRING SUBSTRATE

RELATED APPLICATIONS

The present invention claims priority to Japanese Patent Application No. 2014-001430, filed Jan. 8, 2014, which is incorporated herein by reference in its entirety.

BACKGROUND

1. Technical Field

The present invention relates to a wiring substrate, droplet ejection head, printing apparatus, electronic device, and manufacturing method for the wiring substrate.

2. Related Art

Printing apparatuses are commonly used to eject droplets of liquid from an ejection head to perform a printing process on a recording medium, such as a printing sheet. One example of one such printing apparatus including the droplet ejection head is disclosed in JP-A-2006-289943 (Patent Literature 1). As is described in Patent Literature 1, the droplet ejection head includes a cavity that stores ink and a channel forming substrate including an ejection port that communicates with the cavity and ejects the ink in the cavity as droplets. A piezoelectric element is arranged adjacent to the cavity. The piezoelectric element is electrically connected to, via a wire, a driver IC that controls driving of the piezoelectric element. The driver IC drives the piezoelectric element to thereby cause the piezoelectric element to eject ink droplets from the ejection port.

A reservoir substrate is bonded and fixed to the droplet ejection head to be superimposed on the channel forming substrate. A semiconductor integrated circuit such as a driver IC is set on the reservoir substrate. Wires are set from the semiconductor integrated circuit to the piezoelectric element.

A slope is formed on the reservoir substrate. A plurality of wires are set between the slope and the channel forming substrate. A film of an adhesive is present between the reservoir substrate and the channel forming substrate. Wires are also set on the film of the adhesive. An organic matter is included in the adhesive. When wires are set in places that where the wires are in contact with the organic matter, migration easily occurs among the wires. Consequently, there is a risk that a short circuit may occur among the wires. Therefore, there is a demand for a droplet ejection head including a wiring substrate that can suppress occurrence of migration and prevent a short circuit among the wires.

SUMMARY

An advantage of some aspects of the invention is to solve the problems described above, and the invention can be implemented as the following aspects or application examples.

Application Example 1

A first aspect of the invention is directed to a wiring substrate including a first substrate having a first surface, a second substrate connected to the first substrate via an adhesive and having a second surface, and a first wire and a second wire set along the surfaces of the first surface, the adhesive, and the second surface. The wiring substrate includes, between the first wire and the second wire, a recessed section recessed with respect to a first bonding surface of the adhesive in contact with the first wire and a second bonding surface of the adhesive in contact with the second wire.

According to this application example, the first substrate and the second substrate are bonded by the adhesive. A film of the adhesive is located between the first surface of the first substrate and the second surface of the second substrate. The first wire and the second wire are set along the first surface, the adhesive, and the second surface. Therefore, the first wire and the second wire are set on the surface of the adhesive. The recessed section formed by recessing the adhesive is set in the adhesive between the first wire and the second wire.

The length along the surface of the adhesive between the first wire and the second wire is referred to herein as an inter-wire length. As the inter-wire length increases, the potential for migration is reduced between the first wire and the second wire and the possibility of a short circuit between the wires is also reduced. The inter-wire length increased when the recessed section is present compared with when the recessed section is absent in the adhesive. Therefore, when the recessed section is present, it is possible to further suppress occurrence of migration and prevent a short circuit between the wires.

Application Example 2

This application example is directed to the wiring substrate according to the application example described above, wherein a conductive substance is not included in the surface and the inside of the adhesive.

According to this application example, the adhesive does not include a conductive substance in the surface and the inside setoff the adhesive. Examples of conductive substances includes metal, carbon, and the like. When the conductive substance is absent on the surface of the adhesive between the first wire and the second wire, migration is reduced between the first wire and the second wire. Therefore, it is possible to prevent a short circuit between the wires.

Application Example 3

This application example is directed to the wiring substrate according to the application example described above, wherein the depth of the recessed section is equal to or larger than 1 µm and equal to or smaller than 50 µm.

According to this application example, the depth of the recessed section is equal to or larger than 1 µm and equal to or smaller than 50 µm. When the depth of the recessed section is equal to or larger than 1 µm, an effect due to an increase in the inter-wire length is seen. Therefore, it is possible to prevent migration from easily occurring between the first wire and the second wire. When the depth of the recessed section exceeds 50 µm, shape accuracy is deteriorated because the influence of deformation of the adhesive during contraction becomes conspicuous. Therefore, by setting the depth of the recessed section to be equal to or larger than 1 µm and equal to or smaller than 50 µm, it is possible to prevent a short circuit between the wires and obtain the wiring substrate having high shape accuracy.

Application Example 4

This application example is directed to the wiring substrate according to the application example described above, wherein the surface of the recessed section is pear-skin like.

According to this application example, the surface of the recessed section is pear-skin like. That is, unevenness is formed on the surface of the recessed section. In this case, the inter-wire length is long compared with when the surface of the recessed section is a mirror surface. Therefore, it is possible to prevent migration between the first wire and the second wire.

Application Example 5

This application example is directed to a wiring substrate including a first substrate having a first surface, a second substrate connected to the first substrate via an adhesive and having a second surface, and a first wire and a second wire set along the surfaces of the first surface and the second surface. The first wire is separated from the adhesive.

According to this application example, the first substrate and the second substrate are bonded by the adhesive. A film of the adhesive is located between the first surface of the first substrate and the second surface of the second substrate. The first wire and the second wire are set along the first surface and the second surface. The first wire is separated from the adhesive.

The adhesive includes an organic matter. Migration is induced when the organic matter and metal of the wires come into contact with each other. In this application example, the first wire is separated from the adhesive. Therefore, migration is reduced between the first wire and the second wire. Therefore, it is possible to prevent a short circuit between the wires.

Application Example 6

This application example is directed to a droplet ejection head including a first substrate having a first surface, a second substrate connected to the first substrate via an adhesive and having a second surface, and a first wire and a second wire set along the surfaces of the first surface, the adhesive, and the second surface. The droplet ejection head includes, between the first wire and the second wire, a recessed section recessed with respect to a first bonding surface of the adhesive in contact with the first wire and a second bonding surface of the adhesive in contact with the second wire.

According to this application example, the first substrate and the second substrate are bonded by the adhesive. A film of the adhesive is located between the first surface of the first substrate and the second surface of the second substrate. The first wire and the second wire are set along the first surface, the adhesive, and the second surface. Therefore, the first wire and the second wire are set on the surface of the adhesive. The recessed section formed by recessing the adhesive is set in the adhesive between the first wire and the second wire.

The length along the surface of the adhesive between the first wire and the second wire is referred to herein as an inter-wire length. As the inter-wire length is larger, migration less easily occurs between the first wire and the second wire and a short circuit between the wires less easily occurs. The inter-wire length can be large when the recessed section is present as compared with when the recessed section is absent in the adhesive. Therefore, when the recessed section is present, it is possible to further suppress occurrence of migration and prevent a short circuit between the wires. As a result, the droplet ejection head can suppress occurrence of migration and prevent a short circuit between the wires.

Application Example 7

This application example is directed to a printing apparatus including a droplet ejection head that ejects droplets. The droplet ejection head includes a first substrate having a first surface; a second substrate connected to the first substrate via an adhesive and having a second surface, and a first wire and a second wire set along the surfaces of the first surface, the adhesive, and the second surface. The droplet ejection head includes, between the first wire and the second wire, a recessed section recessed with respect to a first bonding surface of the adhesive in contact with the first wire and a second bonding surface of the adhesive in contact with the second wire.

According to this application example, the printing apparatus includes a droplet ejection head. In the droplet ejection head, the first substrate and the second substrate are bonded by the adhesive. A film of the adhesive is located between the first surface of the first substrate and the second surface of the second substrate. The first wire and the second wire are set along the first surface, the adhesive, and the second surface. Therefore, the first wire and the second wire are set on the surface of the adhesive. The recessed section formed by recessing the adhesive is set in the adhesive between the first wire and the second wire.

As the inter-wire length is larger, migration is less likely to occur between the first wire and the second wire and a short circuit between the wires is also less likely to occur. The inter-wire length can be set large when the recessed section is present compared with when the recessed section is absent. Therefore, when the recessed section is present, it is possible to further suppress the occurrence of migration and prevent short circuits between the wires. As a result, the printing apparatus is described which can suppress occurrence of migration and prevent a short circuit between the wires.

Application Example 8

This application example is directed to a manufacturing method for a wiring substrate including setting a sacrificial film to be superimposed on a portion where a first substrate and a second substrate are bonded by an adhesive and the adhesive is exposed, setting wires over the first substrate, the sacrificial film, and the second substrate, and removing the sacrificial film.

According to this application example, the first substrate and the second substrate are bonded by the adhesive. The adhesive is exposed between the first substrate and the second substrate. The sacrificial film is set to be superimposed on the exposed portion. Subsequently, the wires are set over the first substrate, the sacrificial film, and the second substrate. Subsequently, the sacrificial film is removed. As a result, since the wires are set to be separated from the adhesive, it is possible to prevent occurrence of migration due to the wires.

Application Example 9

This application example is directed to the manufacturing method for the wiring substrate according to the application example described above, wherein the sacrificial film is mainly made of resin.

According to this application example, because the sacrificial film is mainly made of the resin, the resin can be easily removed by being etched by a simple apparatus. Therefore, it is possible to manufacture the wiring substrate with a simple manufacturing apparatus.

Application Example 10

This application example is directed to the manufacturing method for the wiring substrate according to the application example described above, wherein the sacrificial film is mainly made of metal.

According to this application example, the sacrificial film is mainly made of metal. Therefore, the manufacturing method can be a process in which an organic component less easily remains in the wires. Therefore, it is possible to prevent occurrence of migration due to the wires.

Application Example 11

This application example is directed to an electronic device including a wiring substrate mounted with an electronic component, wherein the wiring substrate is the wiring substrate described above.

According to this application example, the electronic device includes the wiring substrate mounted with the electronic component. The wiring substrate according to any one of the application examples 1 to 4 is used as the wiring substrate. Therefore, since occurrence of migration is suppressed in the wiring substrate, the electronic device can be a device including the wiring substrate in which a short circuit between the wires is prevented.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
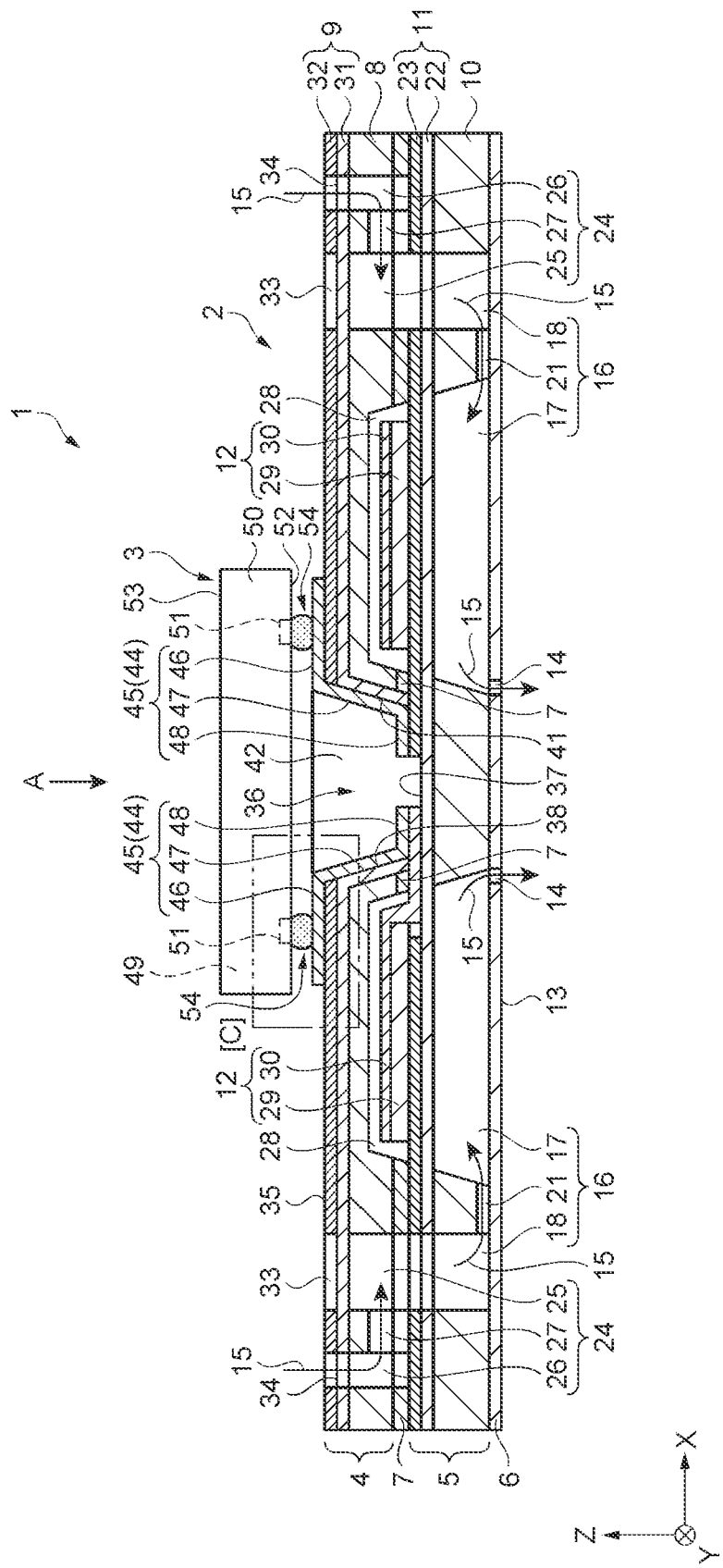
FIG. 1 is a schematic side sectional view showing the structure of a droplet ejection head according to a first embodiment.

In embodiments, examples of a characteristic droplet ejection head and a manufacturing method for the droplet ejection head are explained with reference to the drawings. Note that members in the drawings are shown with scales varied for the respective members to show the members in sizes recognizable on the drawings.

First Embodiment

Figure 2:
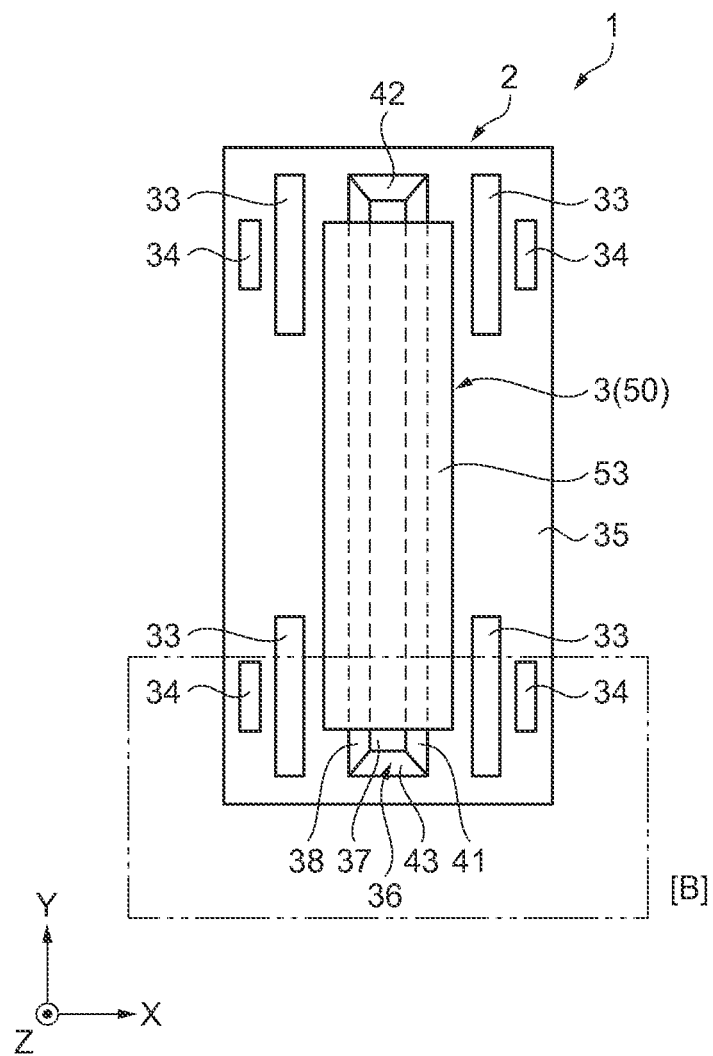
FIG. 2 is a schematic plan view showing the structure of the droplet ejection head.
Figure 3:
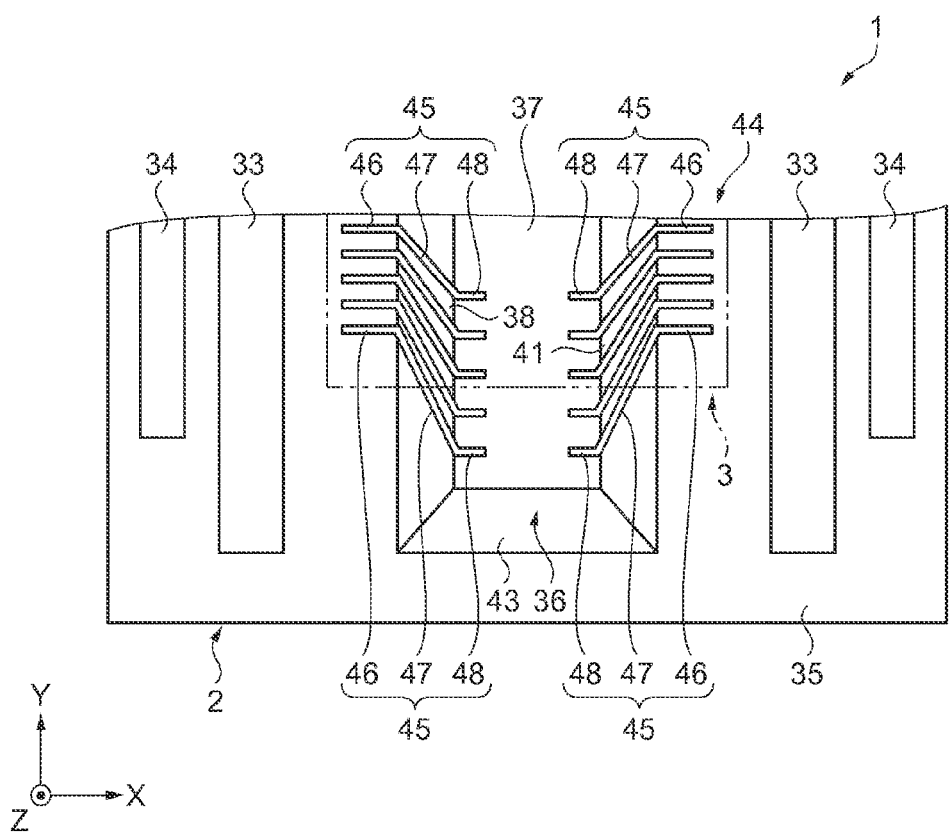
FIG. 3 is a main part schematic plan view showing the structure of the droplet ejection head.

A droplet ejection head according to a first embodiment is explained with reference to FIGS. 1 to 6B. FIG. 1 is a schematic side sectional view showing the structure of the droplet ejection head. FIG. 2 is a schematic plan view showing the structure of the droplet ejection head and is a view of the droplet ejection head viewed from an arrow A direction in FIG. 1. FIG. 3 is a main part schematic plan view showing the structure of the droplet ejection head and is an enlarged detailed view of an area [B] surrounded by an alternate long and short dash line in FIG. 2.

As shown in FIGS. 1 and 2, a droplet ejection head 1 includes a base substrate 2 functioning as a tabular wiring substrate and an IC (Integrated Circuit) package 3 arranged on the base substrate 2. The droplet ejection head 1 is mounted on a printing apparatus (a droplet ejection apparatus). The droplet ejection head 1 can eject ink on a recording medium as droplets and perform printing on the recording medium.

The shape of the base substrate 2 is a rectangular shape in plan view from the arrow A direction. The base substrate 2 includes a sealing plate 4 functioning as a second substrate, a device substrate 5 functioning as a first substrate, and a nozzle substrate 6. The base substrate 2 is a stacked body in which the nozzle substrate 6, the device substrate 5, and the sealing plate 4 are stacked in this order from the lower side. The sealing plate 4 and the device substrate 5 are joined via adhesive films 7 functioning as an adhesive. The thickness of the adhesive films 7 is not particularly limited and is, for example, preferably 1 to 10 μm and more preferably 1 to 5 μm. The device substrate 5 and the nozzle substrate 6 are also joined via not-shown adhesive layers.

The sealing plate 4 is also formed in a stacked structure. The sealing plate 4 includes a reservoir forming substrate 8 and a compliance substrate 9. The reservoir forming substrate 8 and the compliance substrate 9 are stacked in this order from the lower side. The device substrate 5 is also formed in a stacked structure. The device substrate 5 includes a channel forming substrate 10, a vibrating plate 11, and a plurality of piezoelectric elements 12. The channel forming substrate 10, the vibrating plate 11, and the piezoelectric elements 12 are stacked in this order from the lower side. In the stacked bodies, the layers forming the stacked bodies are joined via, for example, not-shown adhesive layers or thermally-welded films.

The nozzle substrate 6 includes a plurality of ejection ports 14. The ejection ports 14 are formed to extend through the nozzle substrate 6 and open on a surface 13 facing a −Z direction of the base substrate 2. The ink is ejected from the ejection ports 14 as droplets. The ejection ports 14 are arranged in a matrix shape. The arrangement of the ejection ports 14 is not particularly limited. In this embodiment, for example, the ejection ports 14 are arranged in a plurality of rows in the longitudinal direction, which is a Y direction, of the base substrate 2 and arranged in two columns in the width direction, which is an X direction.

Note that coating layers having water repellency are provided in the ejection ports 14. Consequently, droplets of ink 15 ejected from the ejection ports 14 drop vertically downward. The droplets can be surely landed in positions where the droplets should be landed on the recording medium. The constituent material of the nozzle substrate 6 is not particularly limited. For example, the constituent material is preferably a silicon material or stainless steel. Since such materials are excellent in resistance to chemicals, even if the nozzle substrate 6 is exposed to the ink 15 for a long time, it is possible to surely prevent the nozzle substrate 6 from being degenerated or deteriorated. Since the materials are easily processed and manufactured, the nozzle substrate 6 having high dimension accuracy can be obtained. Therefore, the droplet ejection head 1 having high reliability can be obtained.

In the channel forming substrate 10, channels 16 through which the ink 15 passes toward the ejection ports 14 are formed. The channels 16 are formed by, for example, etching the channel forming substrate 10. The channels 16 are configured from pressure generating chambers 17, relay chambers 18, and communication paths 21 that cause the pressure generating chambers 17 and the relay chambers 18 to communicate with each other.

The pressure generating chambers 17 are provided to respectively correspond to the ejection ports 14 and communicate with the outside via the ejection ports 14. The relay chambers 18 are provided further on the upstream side than the pressure generating chambers 17. The communication paths 21 are provided between the pressure generating chambers 17 and the relay chambers 18. The constituent material of the channel forming substrate 10 is not particularly limited. For example, a material same as the constituent material of the nozzle substrate 6 can be used.

The vibrating plate 11 is vibrated in the Z direction by vibration of the piezoelectric elements. A part of the vibrating plate 11 faces the pressure generating chambers 17. The vibrating plate 11 vibrates, whereby the pressure of the ink 15 in the pressure generating chambers 17 changes. Consequently, in the pressure generating chambers 17, the ink 15 is ejected as droplets via the ejection ports 14. In the vibrating plate 11, an elastic film 22 and lower electrode films 23 are stacked from the channel forming substrate 10 side. The elastic film 22 is formed of a silicon oxide film having thickness of, for example, about 1 to 2 µm. The lower electrode films 23 are formed of a metal film having thickness of, for example, about 0.2 µm. The lower electrode films 23 function as common electrodes of a plurality of piezoelectric elements arranged between the channel forming substrate 10 and the reservoir forming substrate 8.

In the reservoir forming substrate 8, reservoirs 24 that temporarily store the ink 15 are set to communicate with the channels 16 of the channel forming substrate 10. Each of the reservoirs 24 is configured by a first chamber 25, a second chamber 26, and a communication path 27 that causes the first chamber 25 and the second chamber 26 to communicate with each other.

The first chamber 25 is connected to the relay chamber 18 of the channel 16 of the channel forming substrate 10. A portion between the first chamber 25 and the relay chamber 18 extends through the vibrating plate 11. Consequently, the first chamber 25 and the relay chamber 18 communicate with each other. The second chamber 26 is provided further on the upstream side than the first chamber 25. The communication path 27 is provided between the first chamber 25 and the second chamber 26.

Note that, in the droplet ejection head 1, the relay chambers 18 are also considered to configure a part of the reservoirs 24. In the reservoir forming substrate 8, piezoelectric element housing chambers 28 that house the piezoelectric elements 12 are set. The piezoelectric element housing chambers 28 are independent spaces separated from the reservoirs 24. The constituent material of the reservoir forming substrate 8 is not particularly limited. For example, silicon, glass, and the like can be used.

Each of the piezoelectric elements 12 is formed by stacking the lower electrode film 23, a piezoelectric film 29, and an upper electrode film 30 in order from the elastic film 22 side. The type of the piezoelectric film 29 is not particularly limited. However, in this embodiment, for example, a piezo element is used as the piezoelectric film 29. When a voltage is applied between the upper electrode film 30 and the lower electrode film 23, the piezoelectric film 29 is deformed by a piezoelectric effect. The piezoelectric element 12 can vibrate the vibrating plate 11 in the up-down direction according to the deformation. The pressure in the pressure generating chamber 17 changes according to the vibration of the vibrating plate 11. The piezoelectric element 12 ejects the ink 15 as droplets from the pressure generating chamber 17 via the ejection port 14. In this way, each of the piezoelectric element 12 and the device substrate 5 is configured to eject the ink 15 as droplets from the election port 14 via the vibrating plate 11.

The compliance substrate 9 has structure in which a sealing film 31 and a fixed plate 32 are stacked in order from the reservoir forming substrate 8 side. The sealing film 31 is formed of a material having flexibility. For example, a polyphenylene sulfide film having thickness of about 6 µm is used. A part of the sealing film 31 faces the reservoirs 24. The fixed plate 32 is formed of a relatively hard material such as a metal material. For example, stainless steel having thickness of about 30 µm is used as the material of the fixed plate 32. In the fixed plate 32, fractured sections 33 formed by fracturing portions opposed to the first chambers 25 are set in the fixed plate 32.

Further, in the compliance substrate 9, introduction ports 34 that collectively extend through the sealing film 31 and the fixed plate 32 are formed. The introduction ports 34 are portions that respectively communicate with the reservoirs 24 and introduce the ink 15 into the reservoirs 24. A recessed section 36 opened in the Z direction is set in the center of a surface 35 that faces the Z direction in the base substrate 2. The recessed section 36 is formed by removing the sealing plate 4 with, for example, etching until the recessed section 36 extends through the sealing plate 4 in the thickness direction thereof.

The shape of the recessed section 36 is a groove shape extending along the Y direction, which is the longitudinal direction of the base substrate 2. The recessed section 36 is formed of five surfaces of a bottom section 37, a first sidewall section 38, a first sidewall section 41, a second sidewall section 42, and a second sidewall section 43. The bottom section 37 is a flat portion that faces the Z direction. The first sidewall section 38 and the first sidewall section 41 are located on both sides in the X direction of the bottom section 37 and opposed to each other in the X direction of the recessed section 36.

Each of the first sidewall section 38 and the first sidewall section 41 is inclined with respect to the bottom section 37. An inclination angle of the first sidewall section 38 and the first sidewall section 41 is not particularly limited. Depending on plane orientations of the first sidewall section 38 and the first sidewall section 41, for example, when the reservoir forming substrate 8 is formed of silicon, the inclination angle of the first sidewall section 38 and the first sidewall section 41 is 54.7 degrees. A clearance between the first sidewall section 38 and the first sidewall section 41 gradually increases toward the surface 35 side.

The second sidewall section 42 and the second sidewall section 43 are located on both sides in the Y direction of the bottom section 37 and opposed to each other in the Y direction of the recessed section 36. Each of the second sidewall section 42 and the second sidewall section 43 is also inclined with respect to the bottom section 37 like the first sidewall section 38 and the first sidewall section 41. A clearance between the second sidewall section 42 and the second sidewall section 43 gradually increases toward the surface 35 side. In this way, each of the first sidewall section 38, the first sidewall section 41, the second sidewall section 42, and the second sidewall section 43 is inclined. Consequently, when the recessed section 36 is formed by, for example, etching, it is possible to easily and surely perform the formation.

As shown in FIGS. 1 and 3, wiring patterns 44 are provided in the recessed section 36. The wiring patterns 44 are formed by a large number of wires 45 formed in a linear shape. The wires 45 are respectively arranged in a desired distribution on the first sidewall section 38 side and the first sidewall section 41 side and set along inclined surfaces. A large number of wires 45 present on the first sidewall section 38 side and a large number of wires 45 present on the first sidewall section 41 side are separated from each other in the X direction of the bottom section 37.

The dimensions of the wires 45 in the wiring patterns 44 are not particularly limited. In this embodiment, for example, the width of the wires 45 is 20 μm and the interval between the wires 45 adjacent to each other is 20 μm in a narrow place.

The wires 45 adjacent to each other present on the first sidewall section 38 side are spaced apart from each other in the Y direction of the recessed section 36. That is, the wires 45 are arranged at an interval along the longitudinal direction of the recessed section 36. Further, the interval between the adjacent wires 45 gradually increases toward the bottom section 37 side of the recessed section 36. Since such a gap is formed, the adjacent wires 45 are prevented from being short-circuited on the first sidewall section 38 side.

Similarly, the wires 45 adjacent to each other present on the first sidewall section 41 side are also arranged at an interval along the Y direction of the recessed section 36. The interval between the adjacent wires 45 also gradually increases toward the bottom section 37 side of the recessed section 36. Since such a gap is formed, the adjacent wires 45 are also prevented from being short-circuited on the first sidewall section 41 side.

The wires 45 are formed from the surface 35 of the base substrate 2 to the bottom section 37 of the recessed section 36. Each of the wires 45 is formed in one continuous linear shape. Each of the wires 45 can be divided into an upper section 46, an intermediate section 47, and a lower section 48. The upper section 46 is a portion formed on the surface 35. The intermediate section 47 is a portion formed on the first sidewall section 38 or the first sidewall section 41. The lower section 48 is a portion formed on the bottom section 37. Further, the lower section 48 is connected to the upper electrode film 30 or the lower electrode film 23.

Each of the wires 45 is formed by stacking a first layer and a second layer. The first layer and the second layer are formed of a material having electric conductivity. For example, the first layer is formed of an alloy including Ni—Cr or Ti—W. The second layer is formed of Au. Such constituent materials are metal materials having relatively small electric resistance and are suitable as the constituent material of the wiring patterns 44. Since the wire 45 is formed by two layers, it is possible to easily set the wire 45.

Note that, in this embodiment, each of the wires 45 is formed by the two layers. However, the wire 45 is not limited to this and may be formed by three or more layers. In this case, as the constituent material of the layers, materials having electric conductivity such as Ni, Pd, Au, Ti, Ti—W, and Cu can also be used. The IC package 3 includes an electronic circuit 49 made of a semiconductor element or the like, a casing 50 that houses the electronic circuit 49, and a plurality of terminals 51 exposed from the casing 50 and electrically connected to the electronic circuit 49. The electronic circuit 49 is formed of, for example, a semiconductor.

The casing 50 is a rectangular parallelepiped container and houses the electronic circuit 49 on the inside thereof. The constituent material of the casing 50 is not particularly limited. Examples of the constituent material includes various resin materials, various semiconductor materials, various metal materials, and ceramics. The casing 50 has a surface 52 on the front side facing the −Z direction and a surface 53 on the rear side facing the +Z direction. The terminals 51 are exposed on the surface 52 on the front side. The "surface on the front side" means, for example, a surface on which elements are formed.

The number of the arranged terminals 51 is the same as the number of the wires 45 forming the wiring patterns 44. Each of the terminals 51 is in contact with the upper section 46 of the wire 45 corresponding to the terminal 51. Consequently, the electronic circuit 49 is electrically connected to the wiring patterns 44 via connecting members 54 and the terminals 51. Note that the constituent material of the terminals 51 is not particularly limited. For example, metal materials having relatively small electric resistance such as gold and copper can be used.

Each of the connecting members 54 also has a function of fixing the IC package 3 to the base substrate 2. Consequently, a fixing member for fixing the IC package 3 to the base substrate 2 does not have to be separately provided. The IC package 3 is electrically connected to the piezoelectric elements 12 via the wiring patterns 44. The IC package 3 controls the actuation of the piezoelectric elements 12 to eject the ink 15. One IC package 3 is arranged on one base substrate 2 such that the surface 52 on the front side of the IC package 3 faces the recessed section 36 from the surface 35 side of the base substrate 2. The width of the IC package 3 is larger than the width of the recessed section 36. The IC package 3 is set to extend across the recessed section 36 in the X direction.

The IC package 3 can also reinforce a portion of the base substrate 2 thinned by the formation of the recessed section 36. The length in the Y direction of the IC package 3 is smaller than the length of the recessed section 36. Consequently, the inside of the recessed section 36 communicates with the outside. Therefore, it is possible to discharge heat in the recessed section 36.

The connecting members 54 are respectively arranged between the terminals 51 of the IC package 3 and the upper sections 46 of the wiring patterns 44. The connecting members 54 are metal protrusions (bumps) of Au, Cu, Ni, or the like. For example, an ACF (Anisotropic Conductive Film) or an ACP (Anisotropic Conductive Paste) not shown in the figure may be interposed and compression-bonded with the connecting members 54. Besides, an NCP (Non-Conductive Paste) can be used. In this case, the connecting members 54 and the upper sections 46 are electrically connected. Consequently, the terminals 51 and the upper sections 46 are surely electrically connected via the connecting members 54.

Consequently, the IC package 3 and the wires 45 forming the wiring patterns 44 are electrically connected. The wires 45 are distributed to both of the first sidewall section 38 and the first sidewall section 41. A large number of the wires 45 are arranged along the longitudinal direction of the recessed section 36. Therefore, when the IC package 3 is mounted on the base substrate 2, it is possible to transmit and receive a large amount of information between the IC package 3 and the piezoelectric elements 12 via the wires 45.

Figure 4A:
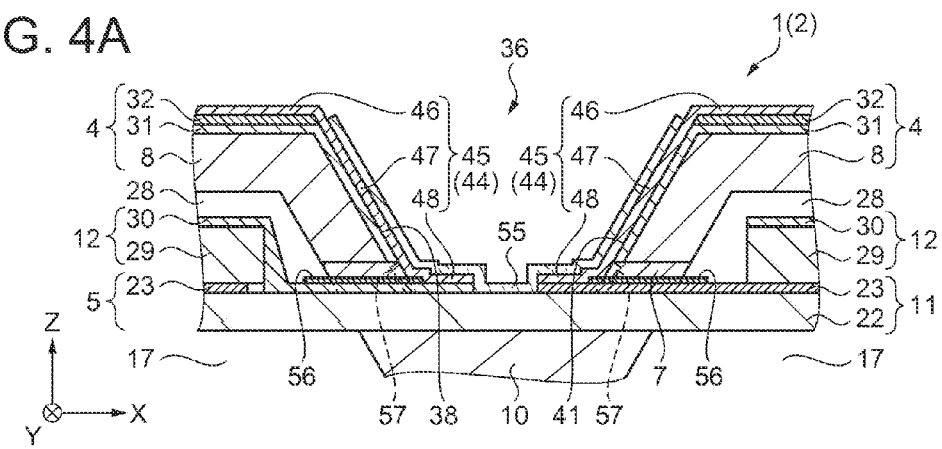
FIGS. 4A to 4C are schematic diagrams for explaining the structure of wires in a recessed section.
Figure 4B:
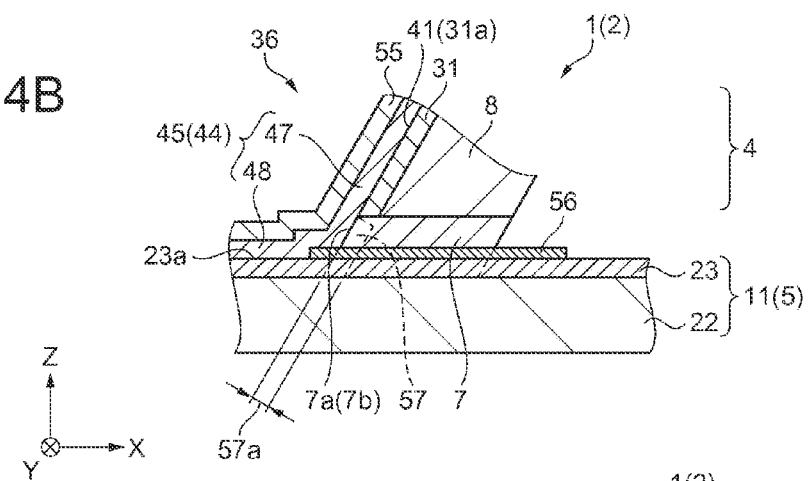
Figure 4C:
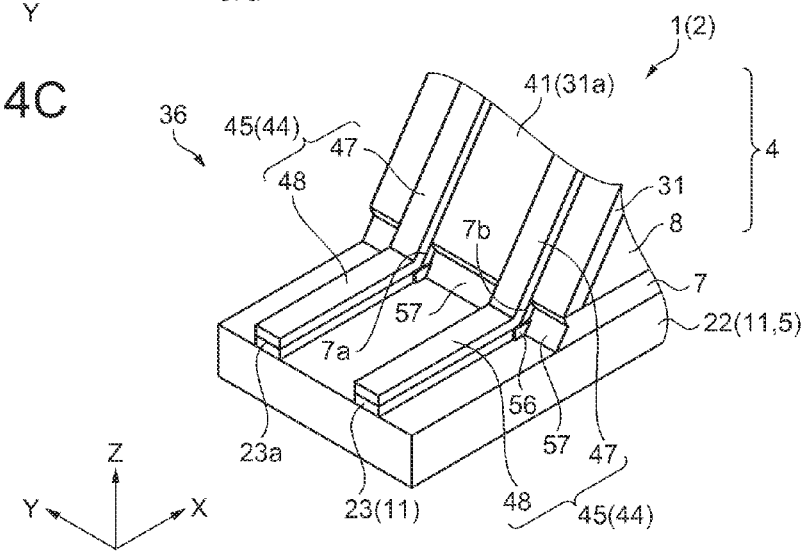

FIGS. 4A to 4C are schematic diagrams for explaining the structure of the wires in the recessed section. FIG. 4A is a main part schematic side sectional view in the recessed section 36. FIG. 4B is a main part schematic side sectional view in the adhesive film 7. FIG. 4C is a main part schematic perspective view in the recessed section 36.

As shown in FIGS. 4A and 4B, in the recessed section 36, a sealing film 55 is set to cover the wires 45. The sealing film 55 prevents moisture from adhering to the wires 45 to cause migration. The sealing film 55 is a film that prevents intrusion of moisture. A material having low moisture permeability and high insulation properties is used. In this embodiment, a thermosetting molding material added with a silica filler or the like is used as the material of the sealing film 55. FIG. 4C is a view in which the sealing film 55 is removed to clearly show the figure.

In the lower electrode films 23, films 56 are set in places where the adhesive films 7 are located. The films 56 cover the adhesive films 7 so as to prevent the adhesive films 7 from coming into contact with the lower electrode films 23. The material of the films 56 only has to be a material having insulation properties. In this embodiment, the material of the films 56 is a material containing, for example, silicon oxide as a main component. When the metal of the lower electrode films 23 and an organic component of the adhesive films 7 come into contact with each other, the metal elutes and migration easily occurs. The lower electrode films 23 do not come into contact with the adhesive films 7 because the lower electrode films 23 are covered with the films 56. Consequently, it is possible to prevent migration from occurring between the lower electrode films 23 adjacent to each other.

Surfaces facing in the Z direction of the lower electrode films 23 are represented as first surfaces 23*a*. The reservoir forming substrate 8 is superimposed on the lower electrode films 23 via the adhesive films 7. The sealing film 31 is set on the recessed section 36 side of the reservoir forming substrate 8. A surface on the recessed section 36 side of the sealing film 31 is represented as a second surface 31*a*. The first surfaces 23*a* and the second surface 31*a* cross each other. The wires 45 are set along the first surfaces 23*a*, the adhesive films 7, and the second surface 31*a*. A surface of the adhesive film 7 in contact with one wire 45 of the adjacent wires 45 is represented as a first bonding surface 7*a*. A surface of the adhesive film 7 in contact with the other wire 45 is represented as a second bonding surface 7*b*.

In places where the adhesive films 7 are not opposed to the wires 45, recessed sections 57 recessed in the thickness direction of intermediate sections 47 with respect to the first bonding surface 7*a* and the second bonding surface 7*b* are set. The depth of the recess of the recessed sections 57 with respect to the first bonding surface 7*a* and the second bonding surface 7*b* is represented as a recessed section depth 57*a*. The recessed section depth 57*a* is preferably set between 1 μm and 50 μm. Length along the surfaces of the adhesive films 7 between the adjacent wires 45 is represented as an inter-wire length. As the inter-wire length is increased, migration less easily occurs between the adjacent wires 45 and the likelihood of a short circuit between the wires 45 is reduced. When the recessed section depth 57*a* is equal to or larger than 1 μm, it is possible to prevent migration from easily occurring. When the recessed section depth 57*a* exceeds 50 μm, since the influence of deformation of the adhesive films 7 during contraction in a process of forming the adhesive films 7 becomes conspicuous, shape accuracy of the base substrate 2 is deteriorated. Therefore, by setting the recessed section depth 57*a* to be equal to or smaller than 50 μm, it is possible to accurately form the base substrate 2.

The interval between the adjacent wires 45 is preferably equal to or larger than 5 μm and more preferably equal to or larger than 7 μm. When the interval between the adjacent wires 45 is equal to or larger than 5 μm, the effect of the recessed section 57 is displayed. When the interval between the adjacent wires 45 is equal to or larger than 7 μm, the effect of the recessed section 57 is surely displayed and a short circuit between the wires 45 less easily occurs. For example, it has been confirmed that migration does not occur in 1000 hours or more in an acceleration test in which a voltage of 60 volts is applied per 20 μm between the adjacent wires 45, temperature is 45° C., and humidity is 90%.

The surface of the recessed section 57 is etched and shaved by plasma. Therefore, since metal is removed even if the metal adheres to the surface of the recessed section 57, the surface of the recessed section 57 is formed as a surface not including metal. The adhesive film 7 is formed of an adhesive not including a conductive substance such as metal or carbon. Therefore, since the adhesive film 7 does not include the conductive substance on the surface and the inside, migration is reduced between the adjacent wires 45.

The surface of the recessed section 57 is pear-skin like. That is, unevenness is formed on the surface of the recessed section 57. In this case, the inter-wire length is larger compared with when the surface of the recessed section 57 is a mirror surface. Therefore, it is possible to prevent migration from easily occurring between the adjacent wires 45.

Figure 5A:
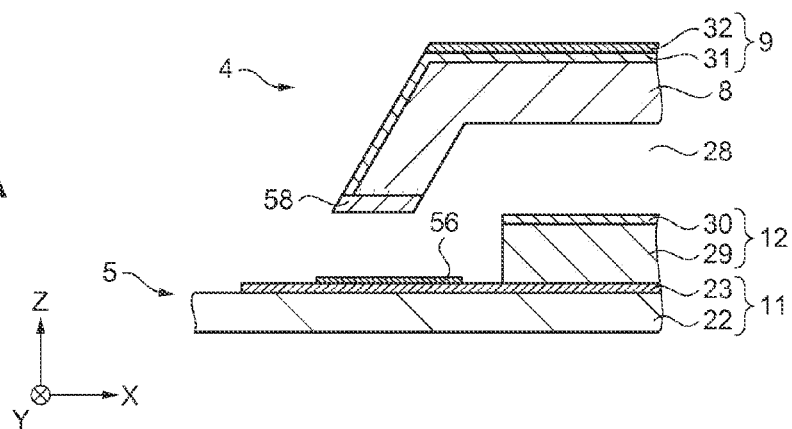
FIGS. 5A to 5C are schematic diagrams for explaining a manufacturing method for the droplet ejection head.

A method of manufacturing the droplet ejection head 1 is explained with reference to FIGS. 5A to 6B. FIGS. 5A to 6B are schematic diagrams for explaining the manufacturing method for the droplet ejection head. First, as shown in FIG. 5A, the sealing plate 4 and the device substrate 5 are prepared. The elastic film 22, the lower electrode film 23, and the like are set on the device substrate 5. On the lower electrode film 23, the film 56 is set in a place where the lower electrode film 23 is joined to the reservoir forming substrate 8. The film 56 is set by patterning SiO after depositing the SiO with low-temperature CVD (Chemical Vapor Deposition).

In the sealing plate 4, a piezoelectric element housing chamber 28 is formed in the reservoir forming substrate 8. The compliance substrate 9 and the like are set on the reservoir forming substrate 8. Note that the sealing plate 4 and the device substrate 5 are manufactured using a publicly-known method. Therefore, explanation of the manufacturing method is omitted. Subsequently, an adhesive 58 is applied to a surface to be jointed to the device substrate 5 in the reservoir forming substrate 8. An application method for the adhesive 58 is not particularly limited. For example, the adhesive 58 may be applied using a syringe besides screen printing and offset printing. The adhesive 58 only has to have bonding strength and resistance against the ink 15 and is not particularly limited. In this embodiment, for example, an epoxy-based adhesive is used as the adhesive 58.

Figure 5B:
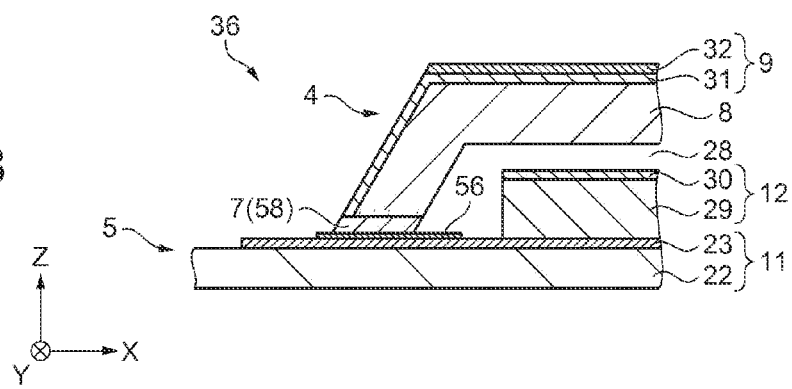

Subsequently, as shown in FIG. 5B, the device substrate 5 and the sealing plate 4 are bonded and fixed. After the bonding, the device substrate 5 and the sealing plate 4 are dried. When the adhesive 58 is thermosetting, the adhesive is heated and hardened. The adhesive 58 solidifies and changes to the adhesive film 7.

Figure 5C:
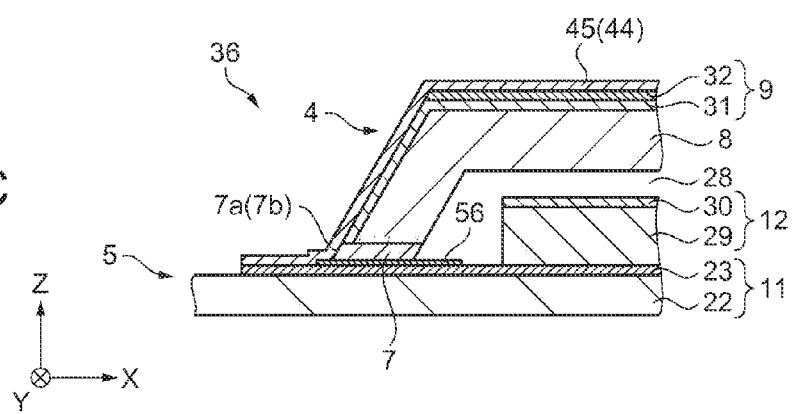

As shown in FIG. 5C, the wire 45 is set over the lower electrode film 23 to the sealing plate 4. First, a metal film is formed by sputtering over entire surfaces facing the Z direction of the sealing plate 4 and the vibrating plate 11. Note that the metal film is formed by, for example, stacking a first layer made of Ni—Cr having thickness of 50 nm and stacking a second layer made of Au having thickness of 700 nm on the first layer. Subsequently, a resist is formed on the metal film. Subsequently, patterning is applied to the resist by exposing and developing the resist using a photolithography method. Subsequently, wet etching is sequentially applied to the Au layer and the Ni—Cr layer. As etching liquid for the Au layer, iodine-based etching liquid is used. As etching liquid for the Ni—Cr layer, nitric acid-based or chloride-based etching liquid is used. Subsequently, the resist is peeled. Consequently, the wiring pattern 44 is formed. After the first layer is formed, the second layer may be stacked by electroless plating.

Figure 6A:
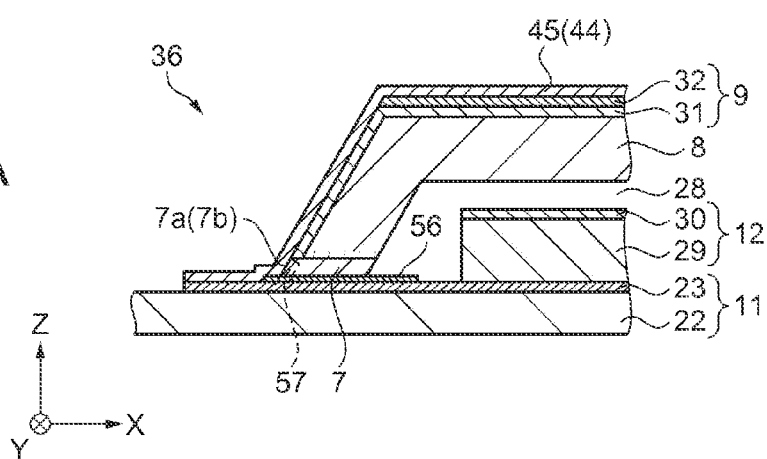
FIGS. 6A and 6B are schematic diagrams for explaining the manufacturing method for the droplet ejection head.

As shown in FIG. 6A, the recessed section 57 is formed in the adhesive film 7. First, a resist is applied to the entire surfaces facing the Z direction of the sealing plate 4 and the vibrating plate 11 and the resist is dried. Subsequently, patterning is applied to the resist by exposing and developing the resist using the photolithography method. The resist is opened in the shape of the recessed section 57.

Subsequently, short-wavelength light of $O_2$ plasma is irradiated on the resist to etch the resist. The wavelength of the short-wavelength light is preferably in a range of 100 nm to 254 nm. When the wavelength is larger than 254 nm, workability is deteriorated because the etching takes time. When the wavelength is smaller than 100 nm, it is difficult to manufacture an apparatus because energy is high. The $O_2$ plasma oxidizes components of the adhesive film 7 and makes it easy to remove the components. Therefore, it is possible to efficiently etch the resist compared with etching the resist using plasma of inert gas. The resist is removed after being etched. Consequently, the recessed section 57 is completed.

In a process for forming the wiring pattern 44, metal particles and metal ions adhere to and remain on the adhesive film 7. The metal facilitates occurrence of migration between the wires 45. When the resist is etched by the $O_2$ plasma, the metal particles and the metal ions adhering to the adhesive film 7 are removed. As a result, the surface of the recessed section 57 is formed as a surface not including the metal. Migration is suppressed from occurring between the wires 45.

Figure 6B:
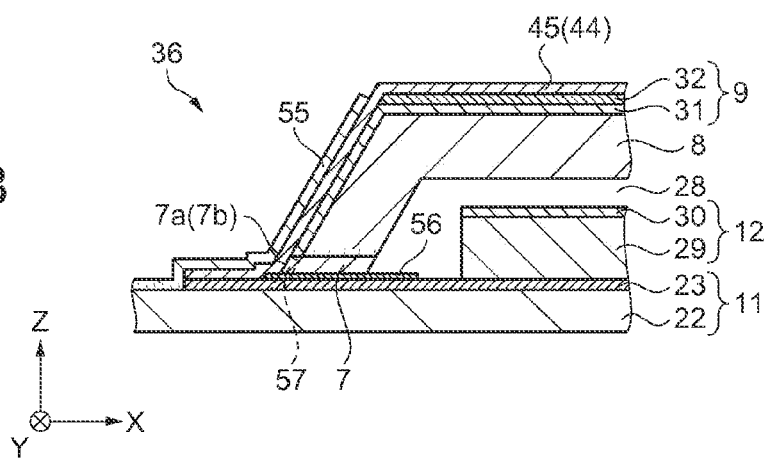

As shown in FIG. 6B, the sealing film 55 is applied to the recessed section 36 and patterned. For the application of the sealing film 55, a spin coat method can be used besides the offset printing and the screen printing. Thereafter, patterning is applied to the sealing film 55 by exposing and developing the sealing film 55 using the photolithography method.

Subsequently, the channel 16 is formed in the channel forming substrate 10. A formation method for the channel 16 is publicly known. Therefore, detailed explanation of the formation method is omitted. The channel forming substrate 10 made of silicon is heated to form a thermal oxide film. After resist is applied and patterned, the thermal oxide film is removed in a predetermined pattern by hydrofluoric acid. After the resist is peeled, anisotropic etching is performed using a KOH solution to form the channel 16.

Subsequently, the nozzle substrate 6, in which the ejection ports 14 are formed, is bonded to the channel forming substrate 10. Subsequently, the connecting members 54 are set in the upper sections 46 of the wires 45 and the IC package 3 is set. The connecting members 54 are Au bumps. The IC package 3 is set to face the recessed section 36. The terminals 51 of the IC package 3 are set in contact with the connecting members 54. Subsequently, the connecting members 54 are heated at temperature equal to or lower than 170° to mount the IC package 3 on the sealing plate 4. The droplet ejection head 1 is completed by the process explained above.

As explained above, according to this embodiment, there are effects explained below.

(1) According to this embodiment, the recessed section 57 formed by recessing the adhesive film 7 is set in the adhesive film 7 between the adjacent wires 45. The length along the surface of the adhesive film 7 between the adjacent wires 45 is represented as an inter-wire length. As the inter-wire length is increased, migration less easily occurs between the adjacent wires 45 and a short circuit between the wires 45 less easily occurs. The inter-wire length can be increased when the recessed section 57 of the adhesive film 7 is present compared with when the recessed section 57 is absent. Therefore, when the recessed section 57 is present, it is possible to further suppress occurrence of migration and prevent a short circuit between the wires 45.

(2) According to this embodiment, the surface of the adhesive film 7 is removed by the $O_2$ plasma in the recessed section 57. Therefore, the adhesive film 7 not including metal on the surface is set between the adjacent wires 45. When metal is absent on the surface of the adhesive film 7 between the adjacent wires 45, migration less easily occurs between the adjacent wires 45. Therefore, it is possible to prevent a short circuit between the adjacent wires 45.

(3) According to this embodiment, the depth of the recessed section 57 is equal to or larger than 1 μm and equal to or smaller than 50 μm. When the depth of the recessed section 57 is 1 μm, an effect due to an increase in the length between the adjacent wires 45 is seen. Therefore, it is possible to prevent migration from occurring between the adjacent wires 45. When the depth of the recessed section 57 exceeds 50 μm, shape accuracy of the base substrate 2 is deteriorated because the influence of deformation of the adhesive 58 during contraction becomes conspicuous. Therefore, by setting the depth of the recessed section 57 to be equal to or larger than 1 μm and equal to or smaller than 50 μm, it is possible to prevent a short circuit between the wires 45 and manufacture the base substrate 2 having high shape accuracy.

(4) According to this embodiment, the surface of the recessed section 57 is pear-skin like. That is, unevenness is formed on the surface of the recessed section 57. In this case, the inter-wire length is long compared with when the surface of the recessed section 57 is a mirror surface. Therefore, it is possible to prevent migration from easily occurring between the adjacent wires 45.

Second Embodiment

Figure 7A:
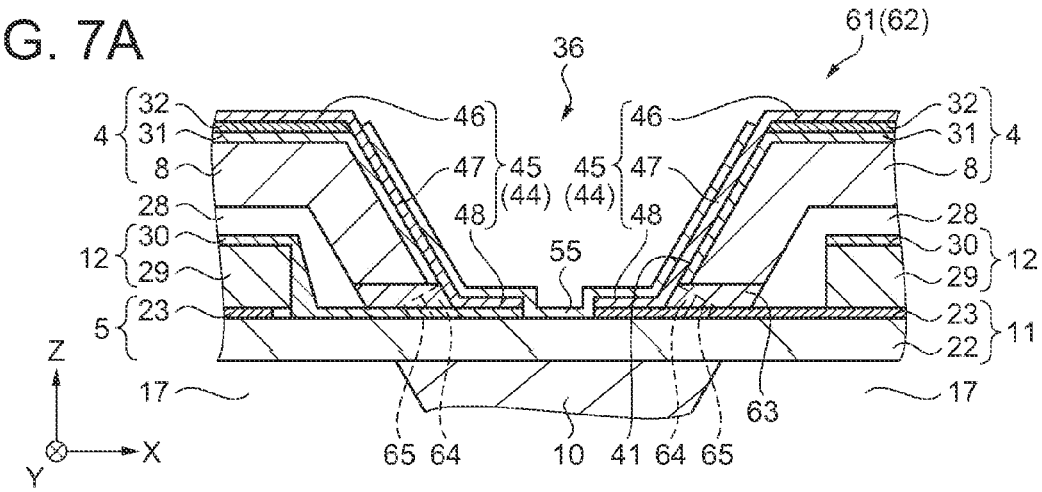
FIGS. 7A to 7C are schematic diagrams for explaining the structure of wires in a recessed section according to a second embodiment.
Figure 7B:
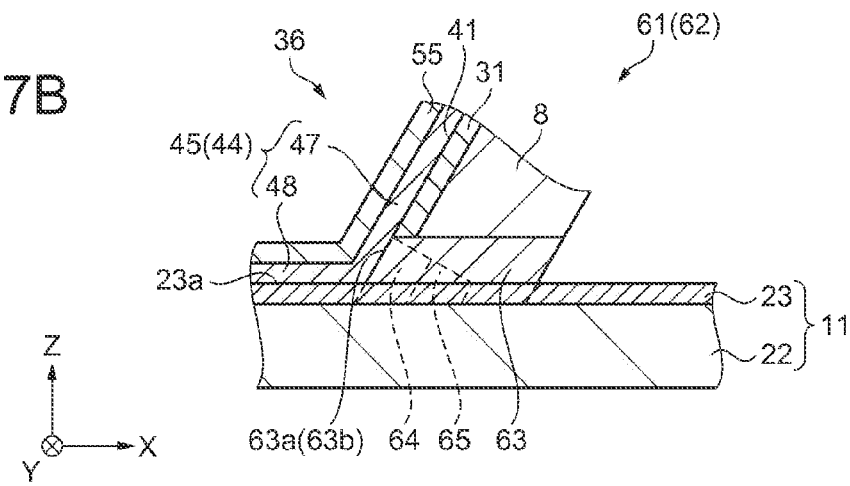
Figure 7C:
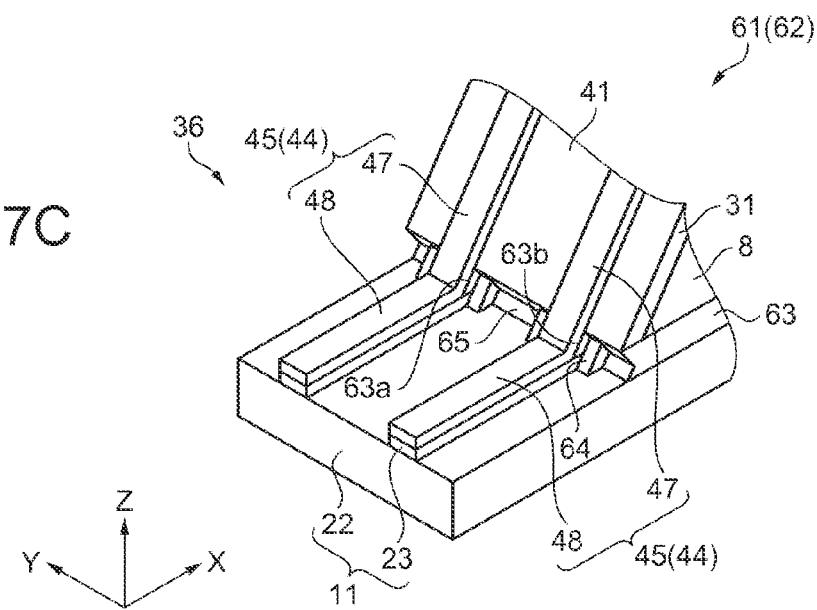

A droplet ejection head according to a second embodiment is explained with reference to schematic diagrams of FIGS. 7A to 7C for explaining the structure of wires in a recessed section. FIG. 7A is a main part schematic side sectional view in the recessed section 36. FIG. 7B is a main part schematic side sectional view in an adhesive film. FIG. 7C is a main part schematic perspective view in the recessed section and is a diagram in which the sealing film 55 shown in FIGS. 4A and 4B are omitted. This embodiment is different from the first embodiment in that the films 56 shown in FIGS. 4A and 4B are omitted and the shape of the recessed section 57 is different. Note that explanation is omitted concerning similarities to the first embodiment.

In this embodiment, as shown in FIGS. 7A to 7C, a droplet ejection head 61 includes a base substrate 62. In the base substrate 62, the vibrating plate 11 and the reservoir forming substrate 8 are bonded by an adhesive film 63. In the adhesive film 63, a first recessed section 64 and a second recessed section 65 are set.

A surface of the adhesive film 63 in contact with one wire 45 of the wires 45 adjacent to each other is represented as a first bonding surface 63a and a surface of the adhesive film 63 in contact with the other wire 45 is represented as a second bonding surface 63b. The first recessed section 64 is recessed with respect to the first bonding surface 63a and the second bonding surface 63b. The second recessed section 65 is recessed with respect to the first recessed section 64. The lower electrode films 23 are inserted into the adhesive film 63 in the first recessed section 64. Therefore, the second recessed section 65 is set on the surface of the adhesive film 63 between the lower electrode films 23 adjacent to each other. The distance between the adjacent lower electrode films 23 along the surface of the adhesive film 63 is represented as an inter-lower electrode length. The inter-lower electrode length is large compared with when the second recessed section 65 is absent. Therefore, migration less easily occurs between the adjacent lower electrode films 23.

The wires 45 are in contact with the sealing film 31 in the intermediate sections 47. A surface of the sealing film 31 in contact with the wires 45 and the first bonding surface 63a and the second bonding surface 63b of the adhesive film 63 in contact with the wires 45 are located on the same plane. The first recessed section 64 is recessed with respect to the first bonding surface 63a and the second bonding surface 63b of the adhesive film 63 in contact with the wires 45. Further, the second recessed section 65 is recessed with respect to the first recessed section 64. The distance between the adjacent wires 45 along the surface of the adhesive film 63 is represented as an inter-wire length. The inter-wire length is long compared with when the second recessed section 65 is absent. Therefore, it is possible to further prevent migration from occurring than when only the first recessed section 64 is set between the adjacent wires 45.

As explained above, according to this embodiment, there are effects explained below.

(1) According to this embodiment, the first recessed section 64 and the second recessed section 65 have the adhesive film 63 set therein between the adjacent wires 45. The inter-lower electrode length can increased when the second recessed section 65 is present compared with when the second recessed section 65 is absent in the adhesive film 63. Therefore, when the second recessed section 65 is present, it is possible to further suppress occurrence of migration and prevent a short circuit between the lower electrode films 23.

The inter-wire length can be increased when the first recessed section 64 and the second recessed section 65 are present compared with when the first recessed section 64 and the second recessed section 65 are absent in the adhesive film 63. Therefore, when the first recessed section 64 and the second recessed section 65 are present, it is possible to further suppress occurrence of migration and prevent a short circuit between the wires 45.

Third Embodiment

Figure 8A:
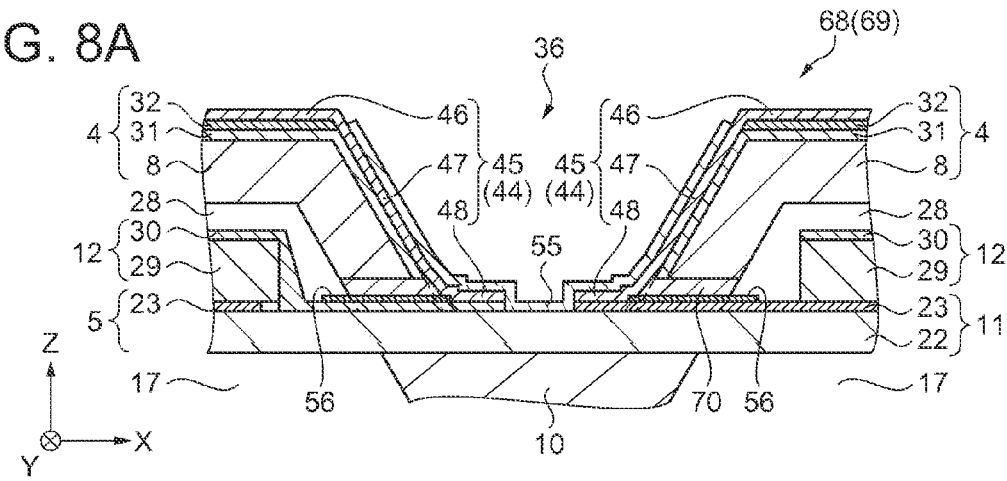
FIGS. 8A to 8C are schematic diagrams for explaining the structure of wires in a recessed section according to a third embodiment.
Figure 8B:
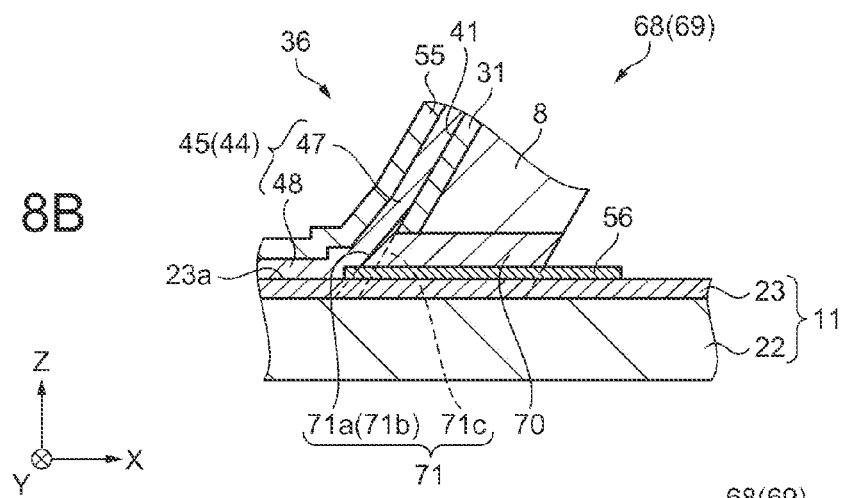
Figure 8C:
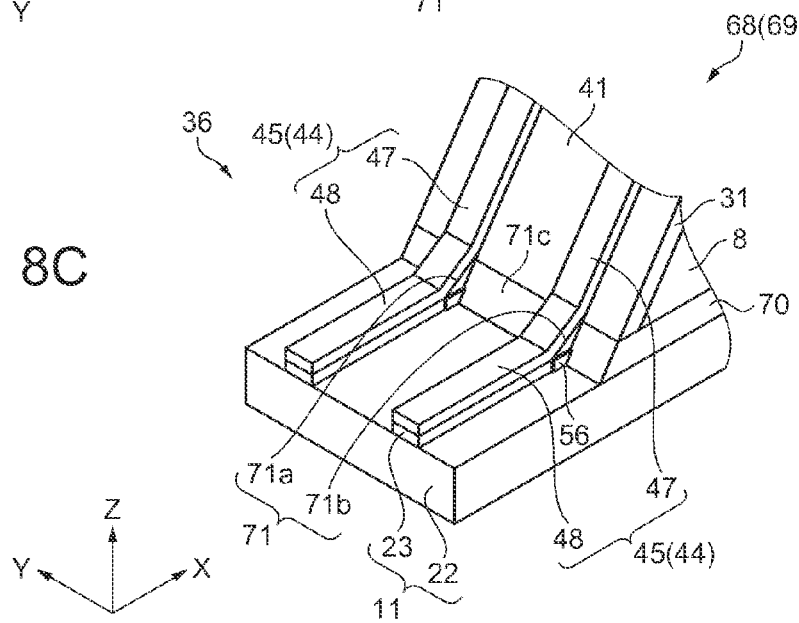

A droplet ejection head according to a third embodiment is explained with reference to schematic diagrams of FIGS. 8A to 8C for explaining the structure of wires in a recessed section. FIG. 8A is a main part schematic side sectional view in the recessed section 36. FIG. 8B is a main part schematic side sectional view in the adhesive film. FIG. 8C is a main part schematic perspective view in the recessed section 36 and is a diagram in which the sealing film 55 is omitted. This embodiment is different from the first embodiment in that the shape of the recessed section 57 shown in FIGS. 4A to 4C is different. Note that explanation is omitted concerning similarities to the first embodiment.

In this embodiment, as shown in FIGS. 8A to 8C, a droplet ejection head 68 includes a base substrate 69. In the base substrate 69, the vibrating plate 11 and the reservoir forming substrate 8 are bonded by an adhesive film 70. A surface of the adhesive film 70 in contact with the wires 45 is gentler than a surface of the sealing film 31 in contact with the wires 45 in the intermediate sections 47. A surface of the adhesive film 70 in contact with one wire 45 of the wires 45 adjacent to each other is represented as a first bonding surface 71a. A surface of the adhesive film 70 in contact with the other wire 45 is represented as a second bonding surface 71b. A surface of the adhesive film 70 between the adjacent wires 45 is represented as a bottom surface 71c. The bottom surface 71c is recessed in the thickness direction of the wires 45 with respect to the first bonding surface 71a and the second bonding surface 71b to be formed as a recessed section 71.

Therefore, the recessed section 71 is set on the surface of the adhesive film 70 between the adjacent wires 45. The distance between the adjacent wires 45 along the surface of the adhesive film 70 is represented as an inter-wire length. The inter-wire length is long compared with when the recessed section 71 is absent. Therefore, migration less easily occurs between the adjacent wires 45.

As explained above, according to this embodiment, there are effects explained below.

(1) According to this embodiment, the recessed section 71 formed by recessing the adhesive film 70 with respect to the first bonding surface 71a and the second bonding surface 71b, and the adhesive film 70 is set between the adjacent wires 45. The length along the surfaces of the wires 45 between the adjacent wires 45 is represented as an inter-wire length. The inter-wire length can be set large when the recessed section 71 is present compared with when the recessed section 71 is absent in the adhesive film 70. Therefore, when the recessed section 71 is present, it is possible to further suppress occurrence of migration and prevent a short circuit between the wires 45.

Fourth Embodiment

Figure 9A:
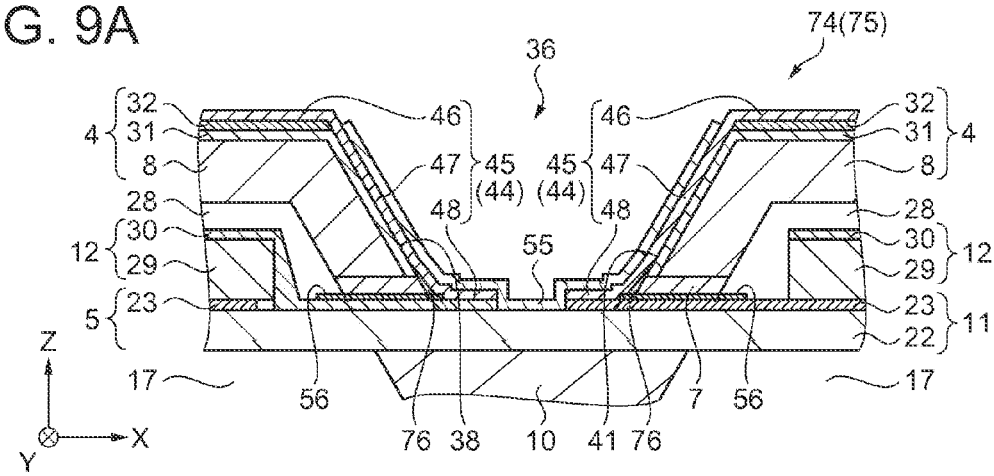
FIGS. 9A to 9C are schematic diagrams for explaining the structure of wires in a recessed section according to a fourth embodiment.
Figure 9B:
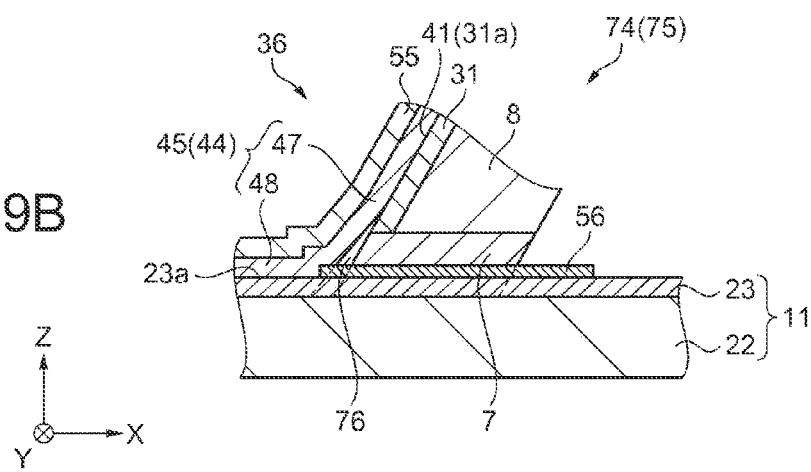
Figure 9C:
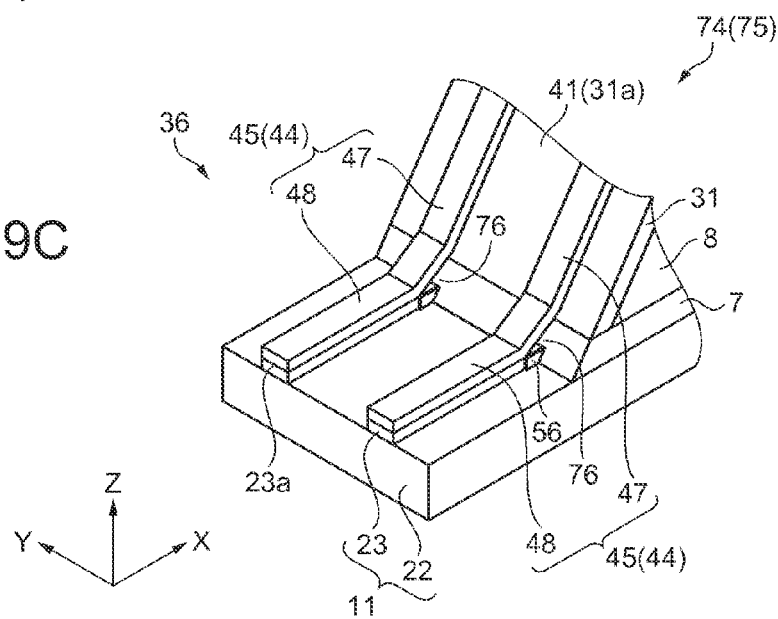

A droplet ejection head according to a fourth embodiment is explained with reference to FIGS. 9A to 11C. FIGS. 9A to 9C are schematic diagrams for explaining the structure of wires in a recessed section. FIG. 9A is a main part schematic side sectional view in the recessed section 36. FIG. 9B is a main part schematic side sectional view in an adhesive film. FIG. 9C is a main part schematic perspective view in the recessed section 36 and is a diagram in which the sealing film 55 is omitted. FIGS. 10A to 11C are schematic diagrams for explaining a manufacturing method for the droplet ejection head. This embodiment is different from the first embodiment in that the shape of the recessed section 57 shown in FIGS. 4A to 4C is different. Note that explanation is omitted concerning similarities to the first embodiment.

In this embodiment, as shown in FIGS. 9A to 9C, a droplet ejection head 74 includes a base substrate 75. In the base substrate 75, the vibrating plate 11 and the reservoir forming substrate 8 are bonded by the adhesive film 7. The wires 45 are set on the sealing film 31 in the intermediate sections 47. The wires 45 are set on the lower electrode films 23 in the lower sections 48. Between the intermediate sections 47 and the lower sections 48, holes 76 are set between the wires 45 and the adhesive film 7. Therefore, the wires 45 are separated from the adhesive film 7. A largest interval between the wires 45 and the adhesive film 7 in the films 56 is 1 μm to 10 μm.

Surfaces facing the Z direction of the lower electrode films 23 are represented as the first surfaces 23a. The reservoir forming substrate 8 is superimposed on the lower electrode films 23 via the adhesive film 7. The sealing film 31 is set on the recessed section 36 side of the reservoir forming substrate 8. A surface on the recessed section 36 side of the sealing film 31 is represented as the second surface 31a. The first surfaces 23a and the second surface 31a are separated surfaces. The wires 45 are set along the first surfaces 23a in the lower sections 48 and set along the second surface 31a in the intermediate sections 47. Since the holes 76 are located between the wires 45 and the adhesive film 7, the wires 45 and the adhesive film 7 are separated.

The adhesive film 7 includes an organic matter. Migration is induced when the organic matter and metal of the wires 45 come into contact with each other. In this application example, the wires 45 are separated from the adhesive film 7. Therefore, migration is reduced between the wires 45 adjacent to each other. Therefore, it is possible to suppress occurrence of migration and prevent a short circuit between the adjacent wires 45.

Figure 10A:
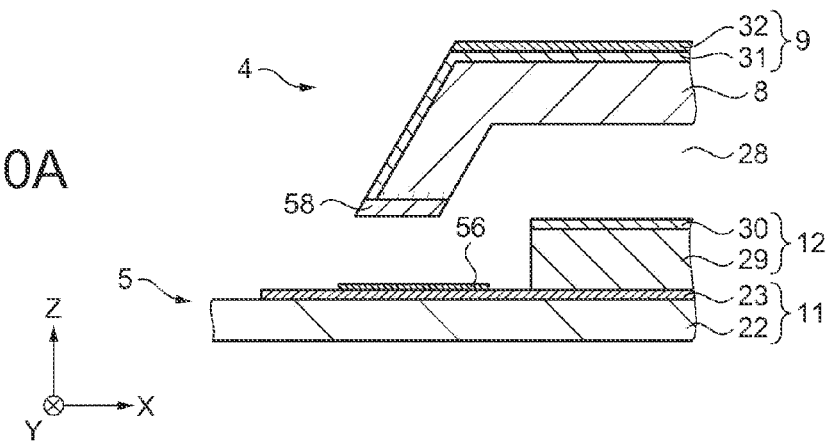
FIGS. 10A to 10C are schematic diagrams for explaining a manufacturing method for a droplet ejection head.

A method of manufacturing the droplet ejection head 74 is explained with reference to FIGS. 10A to 11C. First, as shown in FIG. 10A, the sealing plate 4 and the device substrate 5 are prepared. The elastic film 22, the lower electrode film 23, and the like are set on the device substrate 5. On the lower electrode film 23, the film 56 is set in a place where the lower electrode film 23 is jointed to the reservoir forming substrate 8. In the sealing plate 4, the piezoelectric element housing chamber 28 is formed in the reservoir forming substrate 8. The compliance substrate 9 and the like are set on the reservoir forming substrate 8. Subsequently, the adhesive 58 is applied to a surface to be joined to the device substrate 5 in the reservoir forming substrate 8.

Figure 10B:
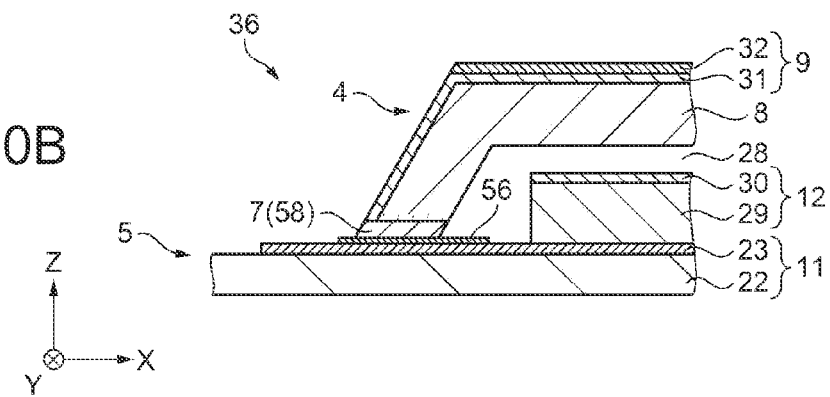

Subsequently, as shown in FIG. 10B, the device substrate 5 and the sealing plate 4 are bonded and fixed. After the bonding, the adhesive 58 is dried. When the adhesive 58 is thermosetting, the adhesive 58 is further heated and hardened. The adhesive 58 solidifies and changes to the adhesive film 7.

Figure 10C:
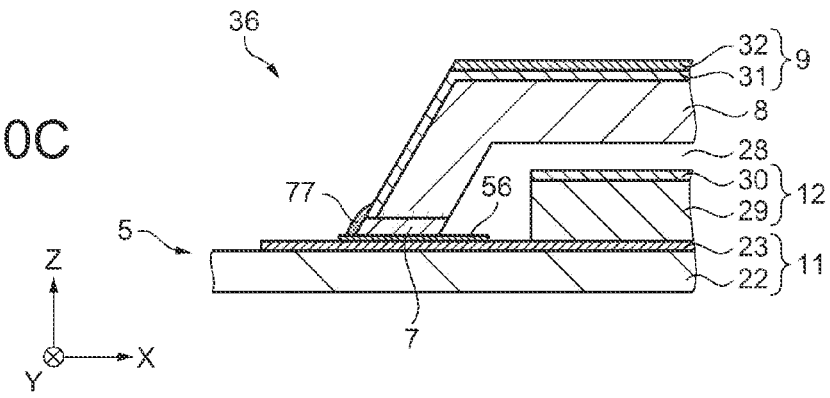

As shown in FIG. 10C, a sacrificial film 77 is arranged to cover the adhesive film 7 exposed on the recessed section 36 side. The sacrificial film 77 prevents the adhesive film 7 from being exposed to the recessed section 36 side. Metal or resin can be used for the sacrificial film 77. The sacrificial film 77 is arranged according to a procedure explained below when metal containing copper as a main component is used for the sacrificial film 77. First, a film of a first resist is formed to cover the recessed section 36. The first resist is patterned using the photolithography method. In the patterning, the first resist is formed to expose a place where the sacrificial film 77 is planned to be set.

Subsequently, a film of metal containing copper as a main component is set to cover the first resist, the film 56, the adhesive film 7, and the sealing film 31. The film of the metal containing copper as the main component is formed using a sputtering method. Subsequently, a second resist is arranged in a place where the sacrificial film 77 is planned to be arranged. After being formed, the second resist is patterned using the photolithography method. Subsequently, the film of the metal containing copper as the main component is etched. The sacrificial film 77 is formed by peeling the second resist. As etching liquid for etching the film of the metal containing copper as the main component, an aqueous ammonium peroxodisulfate solution can be used. Besides, a lift-off method for peeling the first resist after forming the film of the metal containing copper as the main component may be used.

Figure 11A:
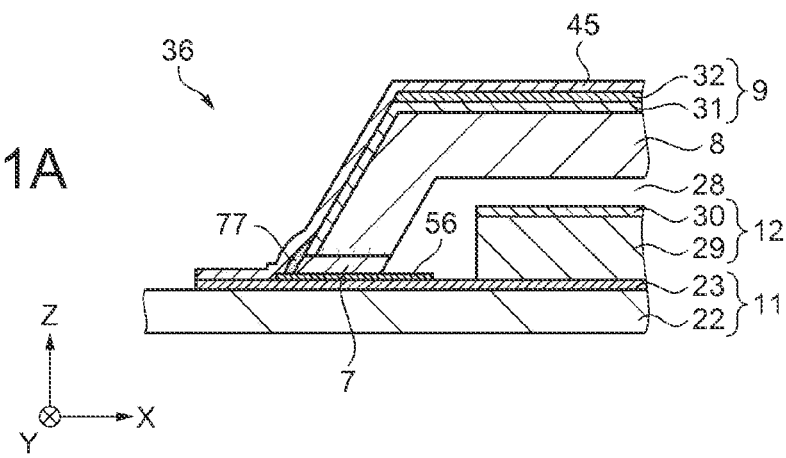
FIGS. 11A to 11C are schematic diagrams for explaining the manufacturing method for the droplet ejection head.

Subsequently, as shown in FIG. 11A, the wire 45 is arranged. The wire 45 is arranged as explained below. First, a metal film of a first layer made of titanium is formed by sputtering. A resist film is formed on the metal film of the first layer. Subsequently, patterning is applied to the resist film by exposing and developing the resist film using the photolithography method. The patterning is performed to cover the metal film of the first layer in the shape of the wire 45. Subsequently, the metal film of the first layer is etched using etching liquid. Subsequently, the resist film is peeled and removed. Ni—Cr may be formed by sputtering in the first layer. In this case, the metal film of the first layer is etched using nitric acid-based or chloride-based etching liquid. Subsequently, a second layer made of a film of gold is set by an electroless plating method. Consequently, the second layer is stacked on the first layer.

Figure 11B:
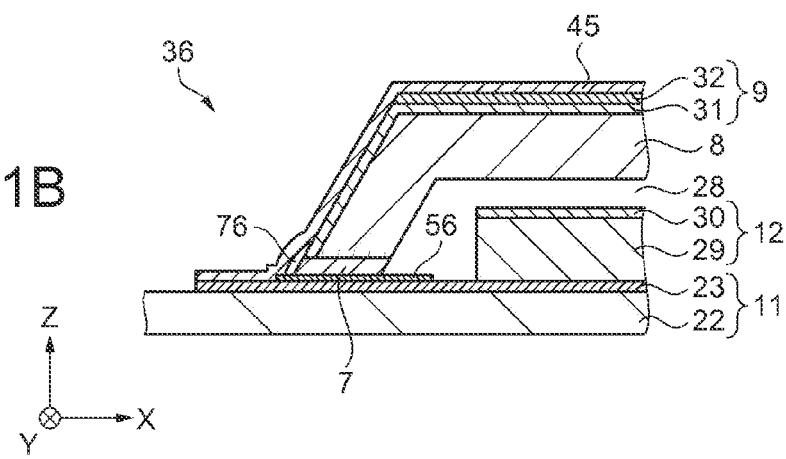

Subsequently, as shown in FIG. 11B, the sacrificial film 77 is etched and removed. As etching liquid for etching the sacrificial film 77 made of the metal containing copper as the main component, the aqueous ammonium peroxodisulfate solution can be used.

Figure 11C:
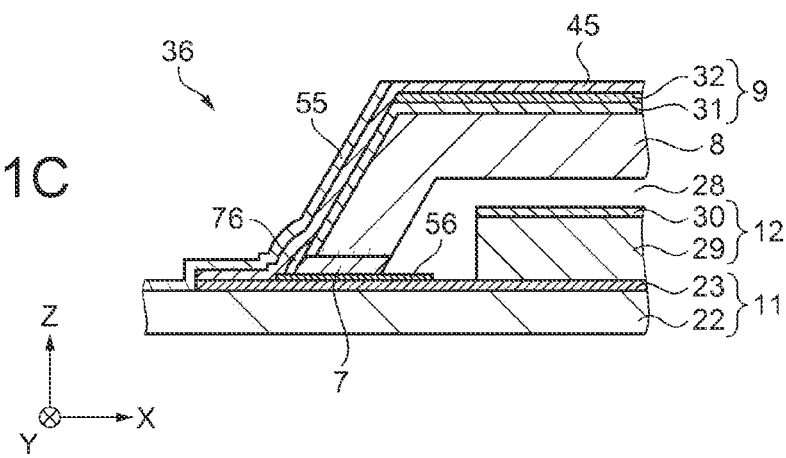

Subsequently, as shown in FIG. 11C, the sealing film 55 is set to cover the wire 45 located in the recessed section 36. First, the sealing film 55 is applied to the recessed section 36 and patterned. For the application of the sealing film 55, the offset printing, the screen printing, and the spin coat method can be used. Thereafter, patterning is applied to the sealing film 55 by exposing and developing the sealing film 55 using the photolithography method. The process explained above is performed in the same manner as in the first embodiment. The droplet ejection head 74 is completed.

As explained above, according to this embodiment, there are effects explained below.

(1) According to this embodiment, the wires 45 are separated from the adhesive film 7. The adhesive film 7 includes an organic matter. Migration is induced when the organic matter and the metal of the wires 45 comes into contact with each other. In this embodiment, the wires 45 are separated from the adhesive film 7. Therefore, migration less easily occurs between the adjacent wires 45. Therefore, it is possible to suppress occurrence of migration and prevent a short circuit of the adjacent wires 45.

(2) According to this embodiment, the sacrificial film 77 is mainly made of metal. Therefore, the manufacturing method can be a process in which an organic component less easily remains in the wires 45. Therefore, it is possible to prevent occurrence of migration due to the wires 45.

Fifth Embodiment

A setting method for wires according to a fifth embodiment is explained with reference to FIGS. 12A to 12H. FIGS. 12A to 12H are schematic diagrams for explaining the structure of a wiring substrate and a manufacturing method for the wiring substrate. This embodiment is different from the first embodiment in that two plates are connected in a plane direction. Note that explanation is omitted concerning similarities to the first embodiment.

Figure 12A:
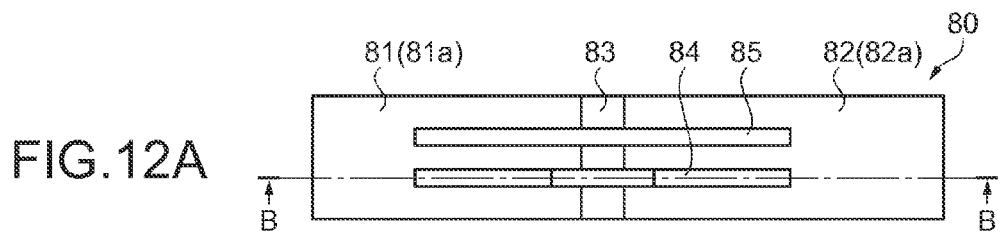
FIGS. 12A to 12H are schematic diagrams for explaining the structure of a wiring substrate and a manufacturing method for the wiring substrate according to a fifth embodiment.
Figure 12B:
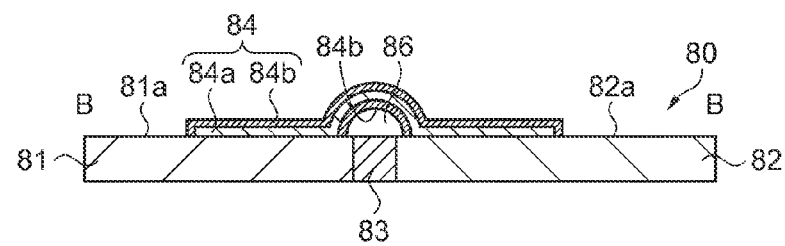

FIG. 12A is a schematic plan view showing the structure of a wiring substrate 80. FIG. 12B is a schematic side sectional view showing the structure of the wiring substrate 80 and is a sectional view taken along line B-B in FIG. 12A. As shown in FIGS. 12A and 12B, in this embodiment, a side surface of a first substrate 81 and a side surface of a second substrate 82 are bonded in a plane direction by an adhesive 83.

The upper surface of the first substrate 81 is represented as a first surface 81a. The upper surface of the second substrate 82 is represented as a second surface 82a. A first wire 84 and a second wire 85 are set along the surfaces of the first surface 81a and the second surface 82a. The first wire 84 and the second wire 85 extend across the adhesive 83 and are set separately from the adhesive 83. A hollow section 86 is set between the adhesive 83 and the first and second wires 84 and 85.

The adhesive 83 includes an organic matter. Migration is induced when the organic matter and metal of the first wire 84 and the second wire 85 come into contact with each other. In this embodiment, the first wire 84 and the second wire 85 are separated from the adhesive 83. Therefore, migration less easily occurs between the first wire 84 and the second wire 85. Therefore, it is possible to suppress occurrence of migration and prevent a short circuit of the first wire 84 and the second wire 85.

The first wire 84 has structure in which a first layer 84a and a second layer 84b are stacked. The materials of the first layer 84a and the second layer 84b are not particularly limited. In this embodiment, for example, the first layer 84a is made of copper and the second layer 84b is made of gold.

Figure 12C:

A manufacturing method for the wiring substrate 80 is explained with reference to the drawings. As shown in FIG. 12C, the adhesive 83 is applied to the first substrate 81 and the second substrate 82 to join the first substrate 81 and the second substrate 82. Subsequently, the adhesive 83 is dried, heated, and solidified.

Figure 12D:
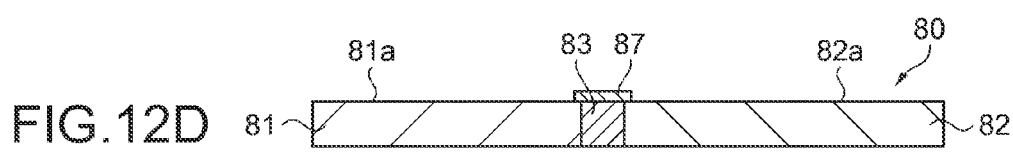

Subsequently, as shown in FIG. 12D, a palladium film is set as a catalyst film 87 to cover the adhesive 83. The catalyst film 87 is set according to, for example, a procedure explained below. First, resist is applied to form a film to cover the first surface 81a, the second surface 82a, and the adhesive 83. Subsequently, the resist film is patterned using the photolithography method. In this case, a place where the catalyst film 87 is planned to be set is opened. Subsequently, after the wiring substrate 80 is treated by an aqueous hydrochloric acid solution of $Sncl_2$, the wiring substrate 80 is immersed in a water solution of $PdCl_2$ to cause the wiring substrate 80 to absorb palladium. Besides, a coupling agent may be used to cause the wiring substrate 80 to absorb palladium. Subsequently, resist is peeled and the palladium on the resist is removed.

Figure 12E:
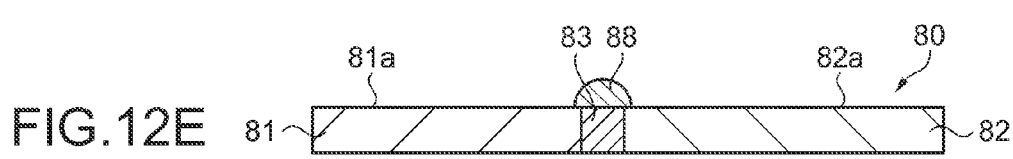

Subsequently, as shown in FIG. 12E, a sacrificial film 88 is set in a place where the catalysis film 87 is set. The sacrificial film 88 is a nickel film. The sacrificial film is formed by immersing the wiring substrate 80 in an electroless nickel bath to deposit nickel on the catalysis film 87.

Figure 12F:

Subsequently, as shown in FIG. 12F, a metal film 89 is set. The metal film 89 is a copper film to be processed into the first layer 84a. The metal film 89 is formed using the sputtering method.

Figure 12G:
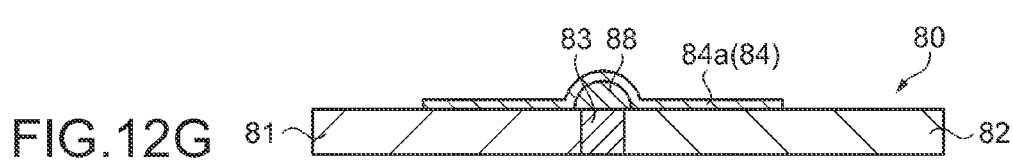

Subsequently, as shown in FIG. 12G, the metal film 89 is patterned into the shape of the first layer 84a. First, resist is applied to form a film to cover the metal film 89. The resist is patterned using the photolithography method. Subsequently, the metal film 89 is etched to peel and remove the resist. The metal film 89 is made of copper. As etching liquid, an aqueous ammonium peroxodisulfate solution is used.

Figure 12H:
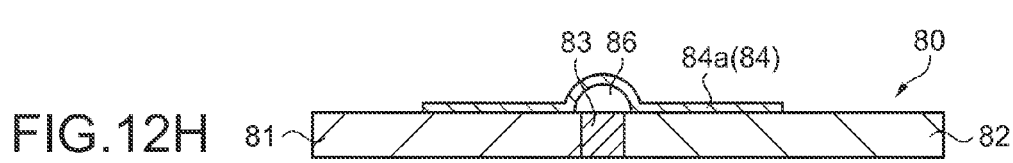

Subsequently, as shown in FIG. 12H, the sacrificial film 88 is etched and removed to form the hollow section 86. The sacrificial film 88 is made of nickel. Etching liquid only has to be capable of selectively etching nickel and is not particularly limited. For example, as the etching liquid, hydrogen peroxide-based etching liquid can be used.

Subsequently, as shown in FIG. 12B, the second layer 84b is set to be superimposed on the surface of the first layer 84a. On the second layer 84b, gold is set by electroless plating. According to the process explained above, the wiring substrate 80 is completed.

As explained above, according to this embodiment, there are effects explained below.

(1) According to this embodiment, even when the first substrate 81 and the second substrate 82 are joined on the same plane by the adhesive 83, the first wire 84 and the second wire 85 are separated from the adhesive 83. Therefore, migration less easily occurs between the first wire 84 and the second wire 85. Therefore, it is possible to suppress occurrence of migration and prevent a short circuit of the first wire 84 and the second wire 85.

Sixth Embodiment

Figure 13:
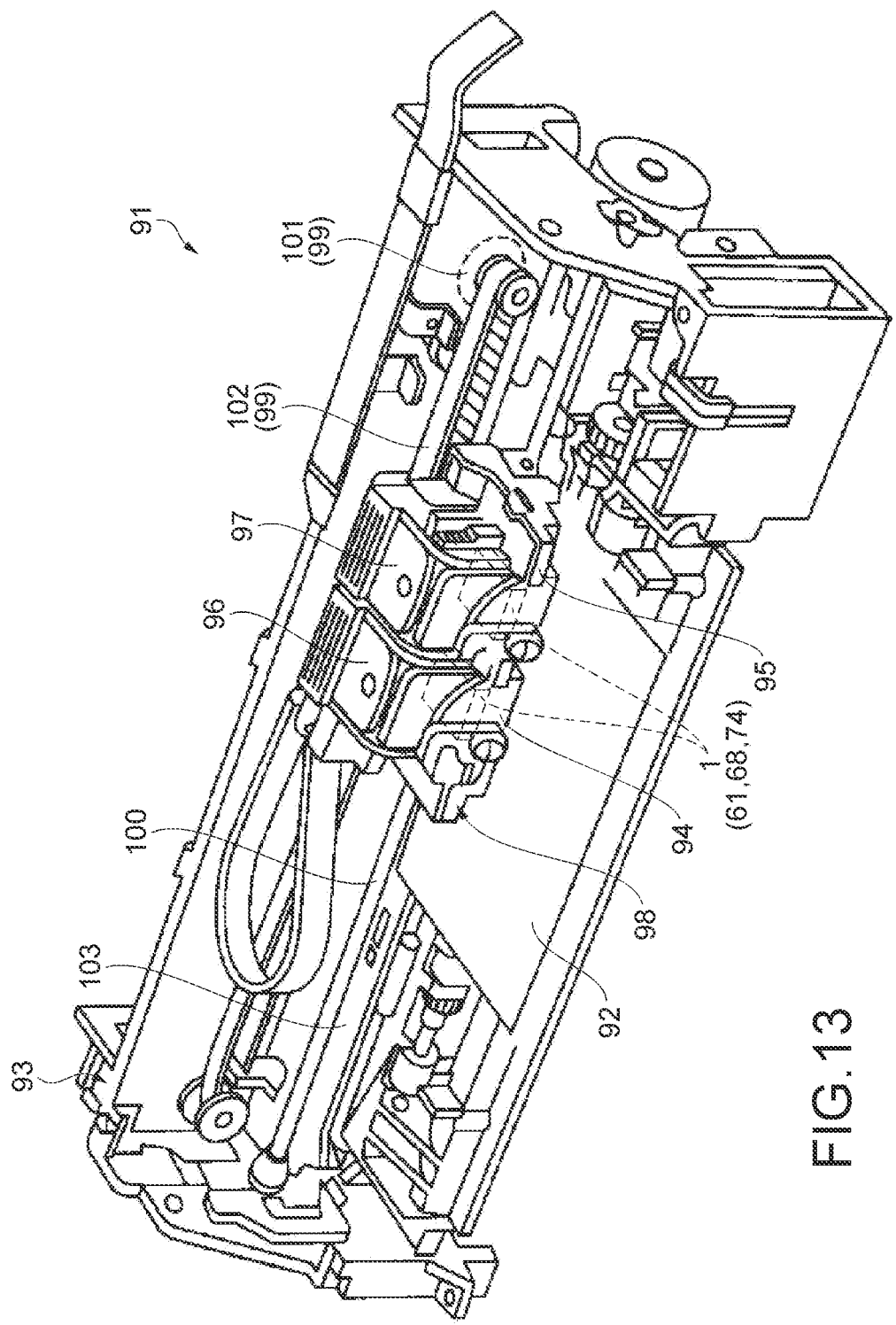
FIG. 13 is a schematic perspective view showing the structure of a printing apparatus according to a sixth embodiment.

A printing apparatus mounted with the droplet ejection head according to a sixth embodiment is explained with reference to FIG. 13. FIG. 13 is a schematic perspective view showing the structure of the printing apparatus. Note that explanation is omitted concerning similarities to the first embodiment.

As shown in FIG. 13, a printing apparatus 91 is a printing apparatus that performs printing on a recording medium 92 in an inkjet system. The printing apparatus 91 includes an apparatus main body 93 and recording head units 94 and 95 mounted with droplet ejection heads 1 and the like. The printing apparatus 91 includes an ink cartridge 96 that supplies the ink 15 to the recording head unit 94 and an ink cartridge 97 that supplies the ink 15 to the recording head unit 95. The printing apparatus 91 includes a carriage 98 that conveys the recording head units 94 and 95 and a moving mechanism 99 that moves the carriage 98. Further, the printing apparatus 91 includes a carriage shaft 100 that movably supports and guides the carriage 98.

The ink cartridge 96 is detachably attached to the recording head unit 94. In a state in which the ink cartridge 96 is attached to the recording head unit 94, the ink cartridge 96 supplies the ink 15 (a black ink composition) to the recording head unit 94. Similarly, the ink cartridge 97 is detachably attached to the recording head unit 95. In a state in which the ink cartridge 97 is attached to the recording head unit 95, the ink cartridge 97 supplies the ink 15 (a color ink composition) to the recording head unit 95.

The moving mechanism 99 includes a driving motor 101 and a timing belt 102 coupled to the driving motor 101. A driving force of the driving motor 101 is transmitted to the carriage 98 via the timing belt 102. The carriage 98 can be moved along the carriage shaft 100 direction together with the recording head units 94 and 95 by the moving mechanism 99.

In the apparatus main body 93, a platen 103 is provided on the lower side of the carriage shaft 100. The platen 103 is provided along the axial direction of the carriage shaft 100. The recording medium 92 fed by a not-shown paper feeding roller or the like is conveyed onto the platen 103. The ink 15 is ejected to the recording medium 92 on the platen 103 to print a predetermined figure.

In the recording head units 94 and 95, any one of the droplet ejection head 1, the droplet ejection head 61, the droplet ejection head 68, and the droplet ejection head 74 is set. The droplet ejection head 1, the droplet ejection head 61, the droplet ejection head 68, and the droplet ejection head 74 have the structure in which migration less easily occurs in the adjacent wires 45. Therefore, the printing apparatus 91 can be an apparatus mounted with the droplet ejection head having the structure in which the adjacent wires 45 are less easily short-circuited by migration.

Embodiments of the invention are not limited to the embodiments explained above. Various changes and improvements can be added to the embodiments by those having ordinary knowledge in the field within the technical idea of the invention. Modifications are explained below.

Modification 1

In the fourth embodiment, the metal containing copper as the main component is used for the sacrificial film 77. Alternatively, metal containing gold as a main component may be used for the sacrificial film 77. In this case, the sacrificial film 77 can be etched using iodine-based Au etching liquid. Easily manufacturable metal may be selected for the sacrificial film 77. In this case, it is preferable to use a titanium tungsten alloy for the first layer of the wire 45 and use copper for the second layer of the wire 45. A film of the titanium tungsten alloy is formed by the sputtering method. A film of the copper is formed by the electroless plating. Besides, a film of nickel may be formed by the electroless plating in the second layer. A film of gold may be formed by the electroless plating in the third layer. The wire 45 easily manufacturable and having a low electric resistance value can be obtained.

Additionally, epoxy-based resin or polyimide-based resin may be used for the adhesive 58. Acrylic-based resin may be used for the sacrificial film 77. An alkali aqueous solution such as a sodium hydroxide solution and an organic solvent such as a N-methyl-2-pyrrolidone can be used for the etching of the sacrificial film 77. By using a resin material as the material of the sacrificial film 77, it is possible to etch and easily remove the material with a simple apparatus. Therefore, it is possible to manufacture the droplet ejection head 74 with a simple manufacturing apparatus.

Modification 2

In the fifth embodiment, the electroless gold plating is applied to the second layer 84b. Alternatively, electroless nickel plating may be performed. Further, the electroless gold plating may be performed over a film formed by the electroless nickel plating. The electroless gold plating and the electroless nickel plating may be selected taking into account a balance between easiness of manufacturing and a resistance value of the first and second wires 84 and 85.

Modification 3

In the first embodiment, the sealing plate 4 is bonded on the device substrate 5 and the recessed section 57 is set in the adhesive film 7. As indicated by the fifth embodiment, a recessed section such as the recessed section 57 may be set in the adhesive 83 sandwiched by the first substrate 81 and the second substrate 82. In this case, the hole 86 may be omitted. Besides, the adhesive 83 may be arranged in the hole 86 in the fifth embodiment. The recessed section can be formed in the same form as the recessed section 71 in the third embodiment. In this case, as in the third embodiment, the droplet ejection head has structure in which migration less easily occurs between the first wire 84 and the second wire 85. Therefore, it is possible to form the wiring substrate 80 as a substrate in which the first wire 84 and the second wire 85 adjacent to each other are less easily short-circuited by migration.

Modification 4

In the first embodiment, the structure in which the recessed section 57 is set in the adhesive film 7 in the droplet ejection head 1 is used. The structure in which the recessed section 57 is set in the adhesive film 7 may be used in other wiring substrates. In an electronic device including a wiring substrate mounted with an electronic component, the wiring substrate may have structure in which the recessed section 57 is set in the adhesive film 7. Further, the forms of the above modifications may be applied to the wiring substrate in addition to the second to the fifth embodiments. In the wiring substrate, occurrence of migration is suppressed. Therefore, the electronic device can be a device including the wiring substrate in which a short circuit between wires is prevented. For example, the forms of the modifications may be applied to electronic devices such as a sensor unit, a gyro sensor, an acceleration sensor, a pressure sensor, and a mirror scanner. A short circuit between the adjacent wires 45 can be prevented in the wiring substrate. Therefore, the electronic device including the wiring substrate can be a device including the wiring substrate having long-time reliability.

What is claimed is:

1. A wiring substrate comprising:
    a first substrate having a first surface;
    a second substrate connected to the first substrate via an adhesive and having a second surface; and
    a first wire and a second wire set along surfaces of the first surface, the adhesive, and the second surface,
    wherein the wiring substrate includes, between the first wire and the second wire, a recessed section forming a recess with respect to a first bonding surface of the adhesive in contact with the first wire and a second bonding surface of the adhesive in contact with the second wire.

2. The wiring substrate according to claim 1, wherein the surface and inside of the adhesive do not comprise a conductive substance.

3. The wiring substrate according to claim 2, wherein depth of the recessed section is equal to or larger than 1 μm and equal to or smaller than 50 μm.

4. An electronic device comprising a wiring substrate mounted with an electronic component, wherein
    the wiring substrate is the wiring substrate according to claim 3.

5. An electronic device comprising a wiring substrate mounted with an electronic component, wherein
    the wiring substrate is the wiring substrate according to claim 2.

6. The wiring substrate according to claim 1, wherein a surface of the recessed section is pear-skin like.

7. An electronic device comprising a wiring substrate mounted with an electronic component, wherein
    the wiring substrate is the wiring substrate according to claim 6.

8. An electronic device comprising a wiring substrate mounted with an electronic component, wherein
    the wiring substrate is the wiring substrate according to claim 1.

9. A droplet ejection head comprising:
    a first substrate having a first surface;
    a second substrate connected to the first substrate via an adhesive and having a second surface; and
    a first wire and a second wire set along surfaces of the first surface, the adhesive, and the second surface,
    wherein the droplet ejection head includes, between the first wire and the second wire, a recessed section forming a recess between a first bonding surface of the adhesive in contact with the first wire and a second bonding surface of the adhesive in contact with the second wire.

10. A printing apparatus comprising a droplet ejection head that ejects droplets,
    wherein the droplet ejection head includes:
        a first substrate having a first surface;
        a second substrate connected to the first substrate via an adhesive and having a second surface; and
        a first wire and a second wire set along surfaces of the first surface, the adhesive, and the second surface, and
    the droplet ejection head includes, between the first wire and the second wire, a recessed section forming a recess with respect to a first bonding surface of the adhesive which in contact with the first wire and a second bonding surface of the adhesive which is in contact with the second wire.

\* \* \* \* \*